(12) United States Patent
Ha et al.

(10) Patent No.: US 11,480,601 B2
(45) Date of Patent: Oct. 25, 2022

(54) SYSTEMS AND METHODS TO IMPROVE DISTANCE PROTECTION IN TRANSMISSION LINES

(71) Applicant: General Electric Technology GmbH, Baden (CH)

(72) Inventors: Hengxu Ha, Stafford (GB); Zhiying Zhang, Markham (CA)

(73) Assignee: General Electric Technology Gmbh, Baden (CH)

( * ) Notice: Subject to any disclaimer, the term of this patent is extended or adjusted under 35 U.S.C. 154(b) by 419 days.

(21) Appl. No.: 16/584,723

(22) Filed: Sep. 26, 2019

(65) Prior Publication Data
US 2021/0096166 A1  Apr. 1, 2021

(51) Int. Cl.
*H02H 7/26* (2006.01)
*G01R 31/08* (2020.01)

(52) U.S. Cl.
CPC ......... *G01R 31/088* (2013.01); *G01R 31/085* (2013.01); *H02H 7/263* (2013.01); *H02H 7/268* (2013.01)

(58) Field of Classification Search
CPC .. G01R 31/088; G01R 31/085; G01R 31/086; H02H 7/263; H02H 7/267; H02H 7/28
See application file for complete search history.

(56) References Cited

U.S. PATENT DOCUMENTS 5,453,903 A * 9/1995 Chow ................... H02H 3/40
361/79

6,173,216 B1   1/2001 Vu et al.
7,872,478 B2   1/2011 Saha et al.
(Continued)

FOREIGN PATENT DOCUMENTS

AU   2000065422 A1   12/2000
AU   754660 B2 *     11/2002
(Continued)

OTHER PUBLICATIONS

A New Algorithm For Digital Impedance Relays, M.S. Sachdev, & M.A. Baribeau, IEEE Transactions on Power Apparatus and Systems, vol. PAS-98, No. 6 Nov./Dec. 1979 (Year: 1979).*
(Continued)

*Primary Examiner* — Tarun Sinha
*Assistant Examiner* — James I Burris
(74) *Attorney, Agent, or Firm* — Eversheds Sutherland (US) LLP

(57) ABSTRACT

Systems and methods are provided herein for improving distance protection in transmission lines. Such systems and methods may involve receiving one or more current and voltage inputs, and determining, based on the one or more current and voltage inputs, one or more current and voltage phasors, wherein the one or more current and voltage phasors are determined using a short window phasor estimation. Such systems and methods may also involve determining, within a single power cycle and based on the one or more current and voltage phasors, a fault in a transmission line. Such systems and methods may also involve sending, to a distance protection element and based on the determination that the fault exists, a signal to clear the fault in the transmission line, and clearing the fault in the transmission line.

20 Claims, 11 Drawing Sheets

(56) References Cited

U.S. PATENT DOCUMENTS

| | | | |
|---|---|---|---|
| 8,675,327 B2* | 3/2014 | Kasztenny | H02H 3/402 |
| | | | 361/80 |
| 9,478,968 B2* | 10/2016 | Blumschein | H02H 7/26 |
| 2018/0284180 A1* | 10/2018 | Ha | H02H 3/405 |
| 2018/0294644 A1 | 10/2018 | Ha et al. | |
| 2018/0301895 A1 | 10/2018 | Sri Gopala Krishna Murthi et al. | |

FOREIGN PATENT DOCUMENTS

| | | |
|---|---|---|
| CA | 2929382 A1 | 5/2014 |
| CN | 102623957 A | 8/2012 |

OTHER PUBLICATIONS

Kasztenny et al., Distance Relays and Capacitive Voltage Transformers—Balancing Speed and Transient Overreach, GE Power Management (GER-3986), Apr. 11-13, 2000 (Year: 2000).*
Office ACTION issued in European Patent Application No. 20198768.2, dated Feb. 26, 2021, 8 pages.
Osman et al., "Wavelet Transform Approach to Distance Protection of Transmission Lies," 2001 IEEE Power Engineering Society Summer Meeting, Conference Proceedings. Vancouver, Canada, Jul. 15-19, 2001; [IEEE Power Engineering Society], New York : IEEE, US, vol. 1, Jul. 15, 2001 (Jul. 15, 2001), pp. 115-120, XP010567673, DOI: 10.1109/PESS.2001.969995 ISBN: 978-0-7803-7173-6 *the whole document*.

* cited by examiner

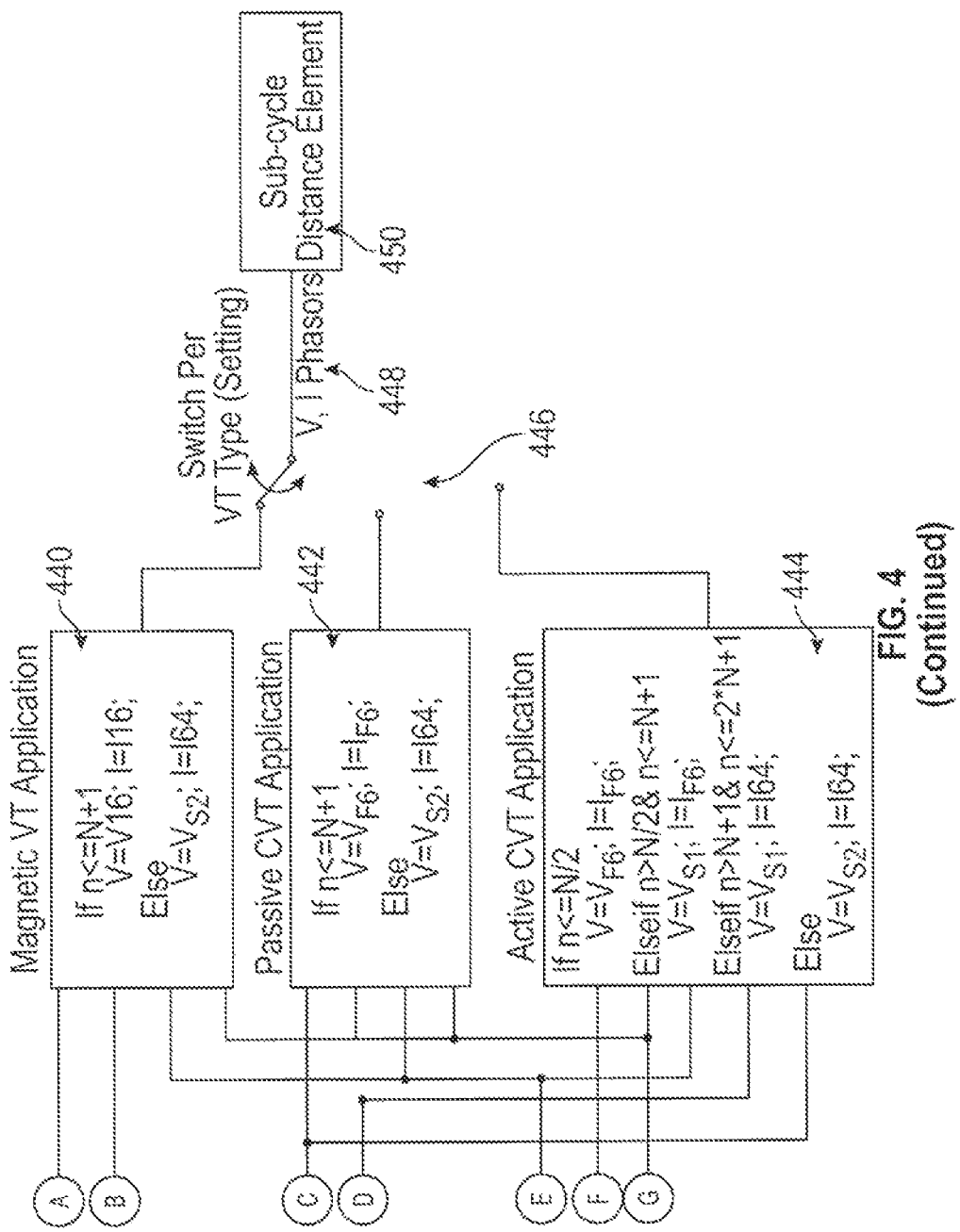

SYSTEMS AND METHODS TO IMPROVE DISTANCE PROTECTION IN TRANSMISSION LINES

TECHNICAL FIELD

The present disclosure relates to distance protection, and more particularly relates to, systems and methods to improve distance protection in transmission lines.

BACKGROUND

In transmission line protection applications, especially for extra high voltage (EHV) and ultra high voltage (UHV) transmission lines, a conventional distance protection element is often used to eliminate faults in the transmission line. The conventional distance protection element is typically required to operate in less than a power cycle to maintain system stability. Conventional distance protection elements employ full-cycle discrete Fourier transform (DFT) algorithms or phaselet algorithms. These algorithms, however, are faced with their own unique downsides. The conventional full cycle DFT algorithms, for example, are unable to operate in less than a single power cycle. Such an algorithm may take about 20 milliseconds to calculate a steady state phasors, which means a final tripping signal will be issued later than 20 milliseconds for 50 Hz transmission lines, which is after a full cycle. Additionally, phaselet-based algorithms (i.e. with partial sums of the products of the waveform samples and the Fourier coefficients), such as half-cycle DFT or quarter-cycle DFT based algorithms may meet the sub-cycle operation time requirements, but typically fail the robustness requirements, which may result in transient overreach, particularly when the input signals contain capacitor voltage transformer (CVT) induced transients and/or decaying direct current (DC) components.

SUMMARY

The disclosure provides systems and methods to improve distance protection in transmission lines. Some or all of the above needs and problems can be addressed by certain embodiments of the disclosure described below.

In at least one embodiment, a computer-implemented method can be provided. The computer-implemented method may include receiving one or more current and voltage inputs. The method may also include determining, based on the one or more current and voltage inputs, one or more current and voltage phasors, wherein the one or more current and voltage phasors are determined using a short window phasor estimation. The method may also include determining, within a single power cycle and based on the one or more current and voltage phasors, a fault in a transmission line. The method may also include sending, to a distance protection element and based on the determination that the fault exists, a signal to clear the fault in the transmission line. The method may also include clearing the fault in the transmission line.

In at least one aspect of some embodiments, short-window phasor estimation may include determining a decaying direct current (DC) time constant. Short-window phasor estimation may also include determining poles of a decaying DC component using the decaying DC time constant. Short-window phasor estimation may also include determining poles of a fundamental frequency component. Short-window phasor estimation may also include determining, using the poles of the decaying DC component and the poles of the fundamental frequency, a matrix. Short-window phasor estimation may also include determining, based on the matrix, a coefficient matrix. Short-window phasor estimation may also include determining coefficients of the one or more current and voltage phasors using the coefficient vector extracted from the coefficient matrix.

In at least one aspect of some embodiments, the method may also include determining that the transmission line comprises a magnetic voltage transformer. The method may also include determining a first number of samples, the first number of samples comprising a number of samples after a fault disturbance detector is triggered and an arming event takes place. The method may also include determining that the first number of samples is less than or equal to a number of samples associated with one cycle. The method may also include determining, based on the determination that the first number of samples is less than or equal to a number of samples associated with one cycle, that the one or more current and voltage phasors are determined using a window size of 16 samples with respect to 64 sample per-cycle.

In at least one aspect of some embodiments, the method may also include determining that the transmission line comprises a magnetic voltage transformer. The method may also include determining a first number of samples, the first number of samples comprising a number of samples after a fault disturbance detector is triggered and an arming event takes place. The method may also include determining that the first number of samples is greater than a number of samples associated with one cycle. The method may also include determining, based on the determination that the first number of samples is greater than a number of samples associated with one cycle, that the one or more current and voltage phasors comprise a current phasor determined using a window size of 64 (with respective to 64 samples per cycle) and a voltage phasor determined by a combination of a phasor determined using a window size of 64 with respect to 64 samples per-cycle and a phasor determined using half-cycle DFT algorithms.

In at least one aspect of some embodiments, the method may also include determining that the transmission line comprises a passive capacitor voltage transformer. The method may also include determining a first number of samples, the first number of samples comprising a number of samples after a fault disturbance detector is triggered and an arming event takes place. The method may also include determining that the first number of samples is less than or equal to a number of samples associated with one cycle. The method may also include determining, based on the determination that the first number of samples is less than or equal to a number of samples associated with one cycle, that the one or more current and voltage phasors are determined using a window size of 6, with respect to 64 samples per-cycle.

In at least one aspect of some embodiments, the method may also include determining that the transmission line comprises a passive capacitor voltage transformer. The method may also include determining a first number of samples, the first number of samples comprising a number of samples after a fault disturbance detector is triggered and an arming event takes place. The method may also include determining that the first number of samples is greater than to a number of samples associated with one cycle. The method may also include determining, based on the determination that the first number of samples is greater than a number of samples associated with one cycle, that the one or more current and voltage phasors comprise a current phasor determined using a window size of 64 with respect to 64 samples per-cycle by said short-window algorithm and a voltage phasor voltage phasor determined by a combination of a phasor determined using a window size of 64, with respect to 64 samples per-cycle by said short-window algorithm and a phasor determined using normal half-cycle DFT algorithms.

In at least one aspect of some embodiments, the method may also include determining that the transmission line comprises an active capacitor voltage transformer. The method may also include determining a first number of samples, the first number of samples comprising a number of samples after a fault disturbance detector is triggered and an arming event takes place. The method may also include determining that the first number of samples is less than or equal to a number of samples associated with one half of a cycle. The method may also include determining, based on the determination that the first number of samples is greater than a number of samples associated with one cycle, that the one or more current and voltage phasors are determined using a window size of 6, with respect to 64 samples per-cycle.

In some embodiments, the method may also include determining that the transmission line comprises an active capacitor voltage transformer. The method may also include determining a first number of samples, the first number of samples comprising a number of samples after a fault disturbance detector is triggered and an arming event takes place. The method may also include determining that the first number of samples is greater than to a number of samples associated with one half of a cycle and is less than or equal to a number of samples associated with one cycle. The method may also include determining, based on the determination that first number of samples is greater than to a number of samples associated with one half of a cycle and is less than or equal to a number of samples associated with one cycle, that the one or more current and voltage phasors comprise a current phasor determined using a window size of 6 with respect to 64 samples per-cycle, and a voltage phasor determined by a combination of a phasor determined using a window size of 6 with respect to 64 samples per-cycle and a phasor determined using normal half-cycle DFT algorithms.

In at least one aspect of some embodiments, the method may also include determining that the transmission line comprises an active capacitor voltage transformer. The method may also include determining a first number of samples, the first number of samples comprising a number of samples after a fault disturbance detector is triggered and an arming event takes place. The method may also include determining that the first number of samples is less than or equal to a number of samples associated with two cycles. The method may also include determining, based on the determination that the first number of samples is less than or equal to a number of samples associated with two cycles, that the one or more current and voltage phasors comprise a current phasor determined using a window size of 64, with respect to 64 samples per-cycle by said short-window algorithm and a voltage phasor determined by a combination of a phasor determined using a window size of 6 with respect to 64 samples per-cycle by said short-window algorithm and a phasor determined using half-cycle DFT algorithms.

In at least one aspect of some embodiments, the method may also include determining that the transmission line comprises an active capacitor voltage transformer. The method may also include determining a first number of samples, the first number of samples comprising a number of samples after a fault disturbance detector is triggered and an arming event takes place. The method may also include determining that the first number of samples is greater than a number of samples associated with two cycles. The method may also include determining, based on the determination that the first number of samples is greater than a number of samples associated with two cycles, that the one or more current and voltage phasors comprise a current phasor determined using a window size of 64 with respect to 64 samples per-cycle by said short-window algorithm and a voltage phasor voltage phasor determined by a combination of a phasor determined using a window size of 64 with respect to 64 samples per-cycle by said short-window algorithm and a phasor determined using normal half-cycle DFT algorithms.

In another embodiment, a system can be provided. The system may include at least one memory configured to store computer-executable instructions; and at least one processor configured to access the at least one memory and execute the computer-executable instructions. In various embodiments, the computer-executable instructions may cause the system to receive one or more current and voltage inputs. The computer-executable instructions may also cause the system to determine, based on the one or more current and voltage inputs, one or more current and voltage phasors, wherein the one or more current and voltage phasors are determined using a short window phasor estimation. The computer-executable instructions may also cause the system to determine, within a single power cycle and based on the one or more current and voltage phasors, a fault in a transmission line. The computer-executable instructions may also cause the system to send, to a distance protection element and based on the determination that the fault exists, a signal to clear the fault in the transmission line. The computer-executable instructions may also cause the system to clear the fault in the transmission line.

In at least one aspect of some embodiments, the computer-executable instructions may also cause the system to determine that the transmission line comprises a magnetic voltage transformer. The computer-executable instructions may also cause the system to determine a first number of samples, the first number of samples comprising a number of samples after a fault disturbance detector is triggered and an arming event takes place. The computer-executable instructions may also cause the system to determine that the first number of samples is less than or equal to a number of samples associated with one cycle. The computer-executable instructions may also cause the system to determine, based on the determination that the first number of samples is less than or equal to a number of samples associated with one cycle, that the one or more current and voltage phasors are determined using a window size of 16, with respect to 64 samples per-cycle by said short-window algorithm.

In at least one aspect of some embodiments, the computer-executable instructions may also cause the system to determine that the transmission line comprises a magnetic voltage transformer. The computer-executable instructions may also cause the system to determine a first number of samples, the first number of samples comprising a number of samples after a fault disturbance detector is triggered and an arming event takes place. The computer-executable instructions may also cause the system to determine that the first number of samples is greater than a number of samples associated with one cycle. The computer-executable instructions may also cause the system to determine, based on the determination that the first number of samples is greater than a number of samples associated with one cycle, that the one or more current and voltage phasors comprise a current phasor determined using a window size of 64 with respect to 64 samples per-cycle by said short-window algorithm and a voltage phasor determined by a combination of a phasor determined using a window size of 64 with respect to 64 samples per-cycle by said short-window algorithm and a phasor determined using half-cycle DFT algorithms.

In at least one aspect of some embodiments, the computer-executable instructions may also cause the system to determine that the transmission line comprises a passive capacitor voltage transformer. The computer-executable instructions may also cause the system to determine a first number of samples, the first number of samples comprising a number of samples after a fault disturbance detector is triggered and an arming event takes place. The computer-executable instructions may also cause the system to determine that the first number of samples is less than or equal to a number of samples associated with one cycle. The computer-executable instructions may also cause the system to determine, based on the determination that the first number of samples is less than or equal to a number of samples associated with one cycle, that the one or more current and voltage phasors are determined using a window size of 6, with respect to 64 samples per-cycle by said short-window algorithm.

In at least one aspect of some embodiments, the computer-executable instructions may also cause the system to determine that the transmission line comprises a passive capacitor voltage transformer. The computer-executable instructions may also cause the system to determine a first number of samples, the first number of samples comprising a number of samples after a fault disturbance detector is triggered and an arming event takes place. The computer-executable instructions may also cause the system to determine that the first number of samples is greater than to a number of samples associated with one cycle. The computer-executable instructions may also cause the system to determine, based on the determination that the first number of samples is greater than a number of samples associated with one cycle, that the one or more current and voltage phasors comprise a current phasor determined using a window size of 64, with respect to 64 samples per-cycle by said short-window algorithm and a voltage phasor voltage phasor determined by a combination of a phasor determined using a window size of 64, with respect to 64 samples per-cycle by said short-window algorithm and a phasor determined using half-cycle DFT algorithms.

In at least one aspect of some embodiments, the computer-executable instructions may also cause the system to determine that the transmission line comprises an active capacitor voltage transformer. The computer-executable instructions may also cause the system to determine a first number of samples, the first number of samples comprising a number of samples after a fault disturbance detector is triggered and an arming event takes place. The computer-executable instructions may also cause the system to determine that the first number of samples is less than or equal to a number of samples associated with one half of a cycle. The computer-executable instructions may also cause the system to determine, based on the determination that the first number of samples is greater than a number of samples associated with one cycle, that the one or more current and voltage phasors are determined using a window size of 6 with respect to 64 samples per-cycle by said short-window algorithm.

In at least one aspect of some embodiments, the computer-executable instructions may also cause the system to determine that the transmission line comprises an active capacitor voltage transformer. The computer-executable instructions may also cause the system to determine a first number of samples, the first number of samples comprising a number of samples after a fault disturbance detector is triggered and an arming event takes place. The computer-executable instructions may also cause the system to determine that the first number of samples is greater than to a number of samples associated with one half of a cycle and is less than or equal to a number of samples associated with one cycle. The computer-executable instructions may also cause the system to determine, based on the determination that first number of samples is greater than to a number of samples associated with one half of a cycle and is less than or equal to a number of samples associated with one cycle, that the one or more current and voltage phasors comprise a current phasor determined using a window size of 6 with respect to 64 samples per-cycle by said short-window algorithm and a voltage phasor determined by a combination of a phasor determined using a window size of 6 with respect to 64 samples per-cycle by said short-window algorithm and a phasor determined using half-cycle DFT algorithms.

In at least one aspect of some embodiments, the computer-executable instructions may also cause the system to determine that the transmission line comprises an active capacitor voltage transformer. The computer-executable instructions may also cause the system to determine a first number of samples, the first number of samples comprising a number of samples after a fault disturbance detector is triggered and an arming event takes place. The computer-executable instructions may also cause the system to determine that the first number of samples is less than or equal to a number of samples associated with two cycles. The computer-executable instructions may also cause the system to determine, based on the determination that the first number of samples is less than or equal to a number of samples associated with two cycles, that the one or more current and voltage phasors comprise a current phasor determined using a window size of 64 with respect to 64 samples per-cycle by said short-window algorithm and a voltage phasor determined by a combination of a phasor determined using a window size of 6 with respect to 64 samples per-cycle by said short-window algorithm and a phasor determined using half-cycle DFT algorithms.

In at least one aspect of some embodiments, the computer-executable instructions may also cause the system to determine that the transmission line comprises an active capacitor voltage transformer. The computer-executable instructions may also cause the system to determine a first number of samples, the first number of samples comprising a number of samples after a fault disturbance detector is triggered and an arming event takes place. The computer-executable instructions may also cause the system to determine that the first number of samples is greater than a number of samples associated with two cycles. The computer-executable instructions may also cause the system to determine, based on the determination that the first number of samples is greater than a number of samples associated with two cycles, that the one or more current and voltage phasors comprise a current phasor determined using a window size of 64 with respect to 64 samples per-cycle by said short-window algorithm and a voltage phasor determined by a combination of a phasor determined using a window size of 64 with respect to 64 samples per-cycle by said short-window algorithm and a phasor determined using half-cycle DFT algorithms.

In at least one embodiment, a non-transitory computer-readable medium may be provided. The computer-readable medium may store computer-executable instructions which when executed by one or more processors result in performing operations including receiving one or more current and voltage inputs. The operations may also include determining, based on the one or more current and voltage inputs, one or more current and voltage phasors, wherein the one or more current and voltage phasors are determined using a short window phasor estimation. The operations may also include determining, within a single power cycle and based on the one or more current and voltage phasors, a fault in a transmission line. The operations may also include sending, to a distance protection element and based on the determination that the fault exists, a signal to clear the fault in the transmission line. The operations may also include clear the fault in the transmission line.

Additional systems, methods, apparatus, features, and aspects are realized through the techniques of various embodiments of the disclosure. Other embodiments and aspects of the disclosure are described in detail herein and are considered a part of the claimed subject matter. Other features can be understood and will become apparent with reference to the description and to the drawings.

BRIEF DESCRIPTION OF THE DRAWINGS

The detailed description is set forth with reference to the accompanying drawings. The use of the same reference numerals may indicate similar or identical items. Various embodiments may utilize elements and/or components other than those illustrated in the drawings, and some elements and/or components may not be present in various embodiments. Elements and/or components in the figures are not necessarily drawn to scale. Throughout this disclosure, depending on the context, singular and plural terminology may be used interchangeably.

DETAILED DESCRIPTION

Overview

The disclosure is directed to, among other things, systems and methods for improving distance protection in transmission lines. To accomplish improved distance protection, a sub-cycle distance algorithm may be used, which can simultaneously meet operating time requirements, accuracy and robustness requirements. These requirements may also be met for a variety of conditions, such as signals with CVT (capacitor voltage transformer) transients, decaying DC and high source impedance ratio (SIR). The sub-cycle distance algorithm may be employed on a second distance protection element that may be introduced to a transmission line in parallel with a first distance protection element that may use more conventional distance protection algorithms as mentioned above (for example, full-cycle DFT). The second distance protection element may serve as an accelerator to the first distance protection element. That is, the first distance protection element may be continuously in operation and the second distance protection element may supplement the operations of the first distance protection element. The second distance protection element may also only be operational for certain numbers of cycles from a disturbance is detected (for example, three cycles), and it is available a period of time (for example, five cycles) after the "normal status" is identified.

In at least one aspect of some embodiments, the sub-cycle algorithm used by the second distance protection element may be based on a short window phasor estimation method with decaying DC accounted in the equation so that the adverse impact to phasor accuracy due to DC offset can be minimized. With additional filtering, averaging, switching and tripping count strategy applied, both sub-cycle operating time, accuracy and robustness requirements (for example, transient overreach less than about 5%) may be achieved under all the test conditions, including CVT type (magnetic VT, passive CVT and active CVT), SIR (0.1 to 60), fault type, fault location, and point on wave.

Illustrative Embodiments

Figure 1:
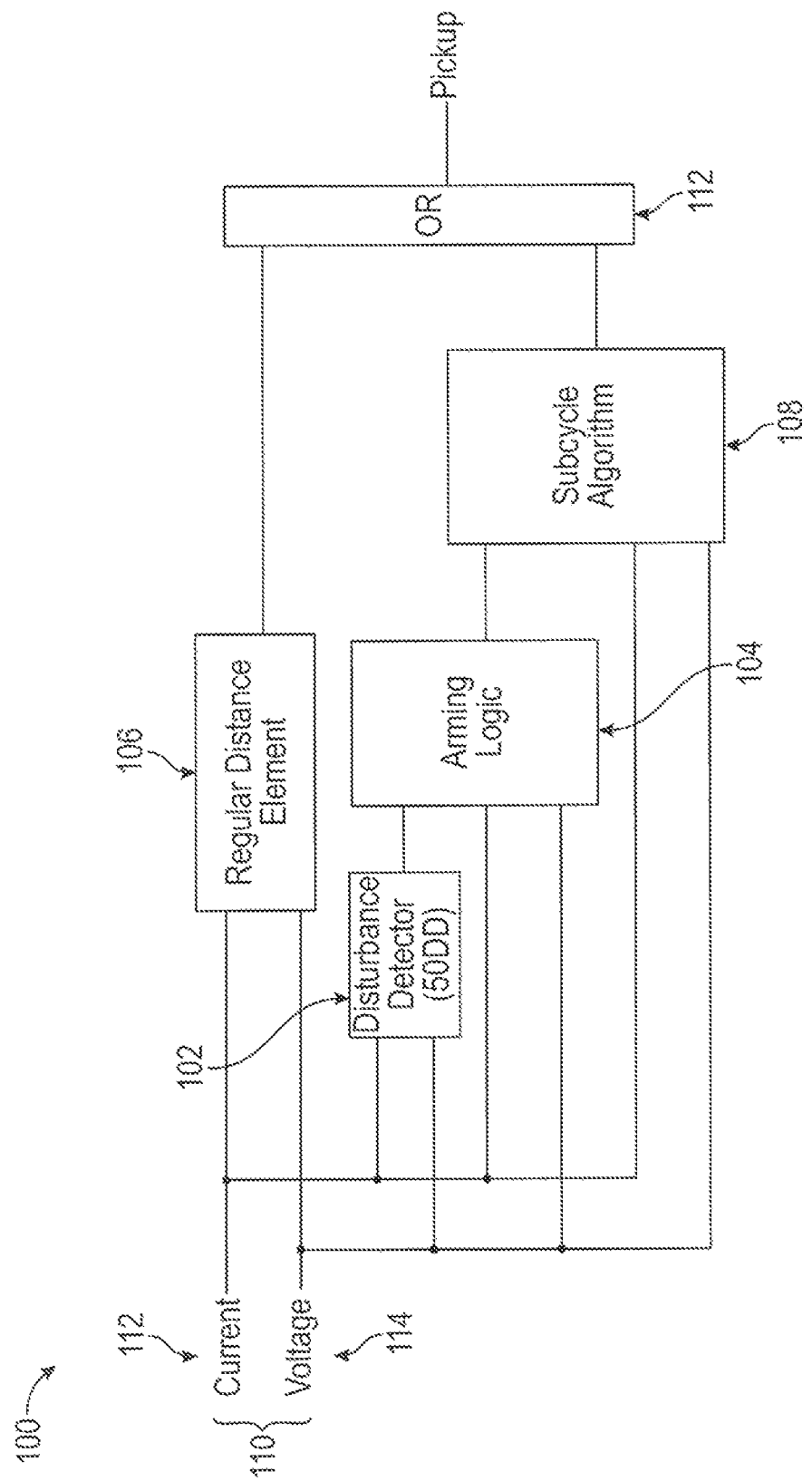
FIG. 1 depicts an illustrative system architecture in accordance with one or more example embodiments of the disclosure.

Turning now to the drawings, FIG. 1 depicts an illustrative system 100 architecture in which techniques and structures of the present disclosure may be implemented. The illustrative architecture 100 may include a disturbance detector 102, an arming logic element 104, a first distance protection element 106, and a second distance protection element 108. The architecture 100 may also receive one or more inputs 110 that may include a current input 112 and a voltage input 114. All of these elements may be employed in association with a transmission line (not depicted in the Figure).

Figure 2:
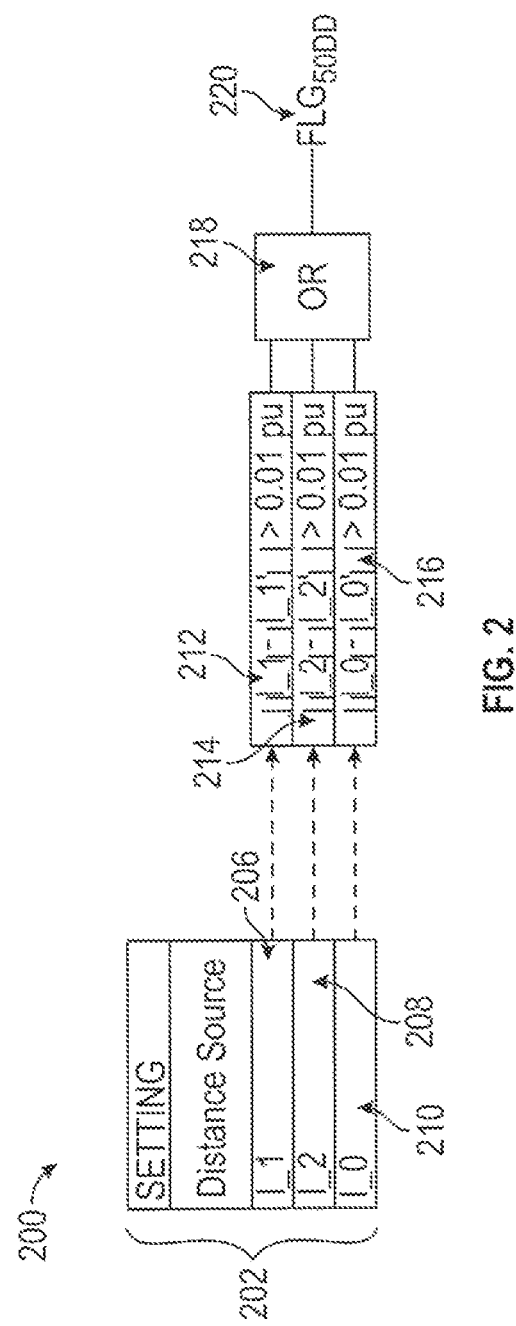
FIG. 2 depicts an illustrative system flow diagram in accordance with one or more example embodiments of the disclosure.

In at least one aspect of some embodiments, the disturbance detector 102, which may be described in further detail with respect to FIG. 2, may serve to provide an indication that a disturbance has occurred on the transmission line. A disturbance may be, for example, a non-negligible change in particular characteristics of the transmission line, such as current and voltage values. Such a change may be an indication that a fault has occurred on the transmission line. The disturbance detector 102 may serve as an input to the arming logic element 104, such that if the disturbance detector 102 detects a disturbance in the transmission line, then the disturbance detector 102 may provide an indication of the disturbance to the arming logic element 104.

Figure 3:
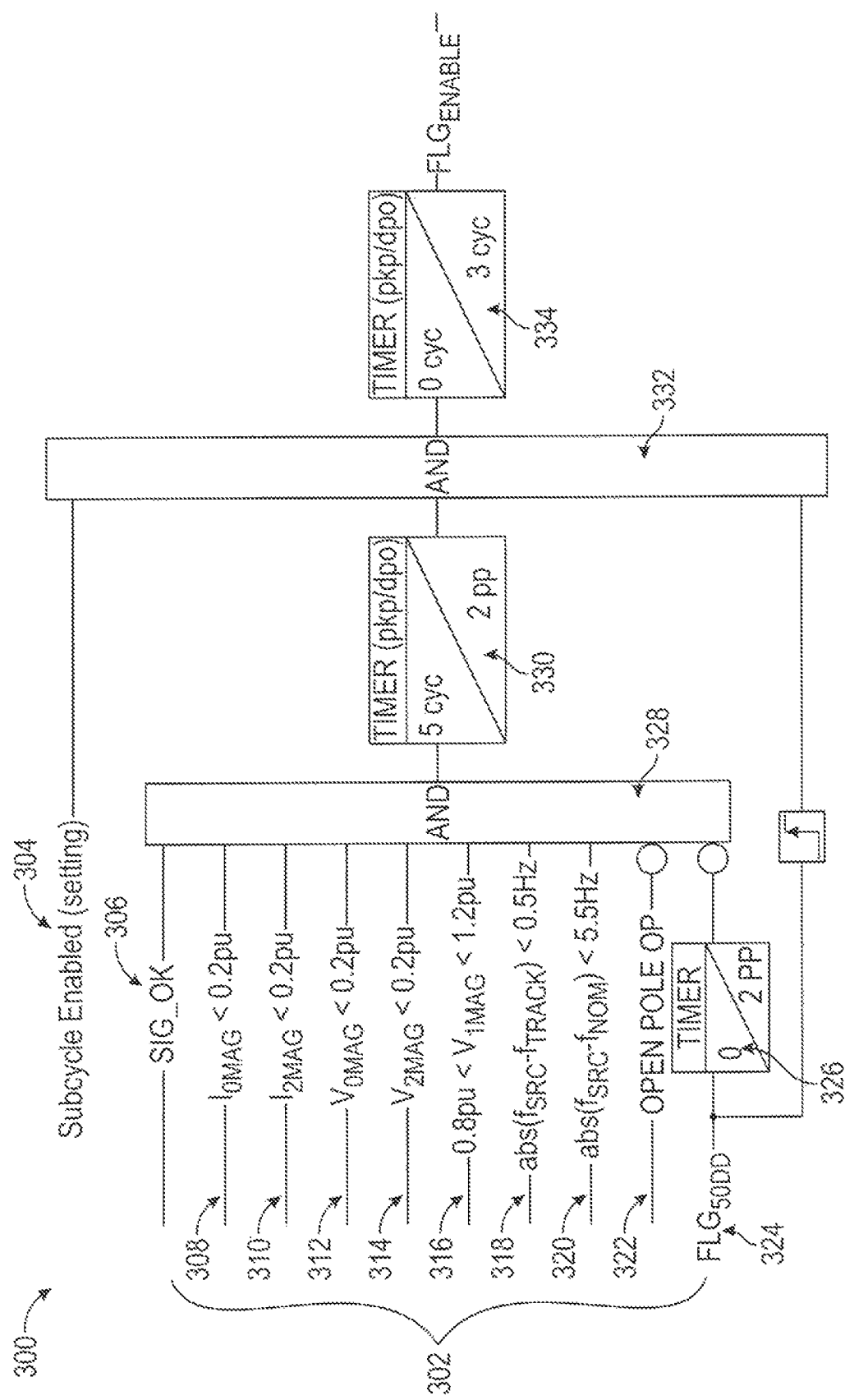
FIG. 3 depicts an illustrative system flow diagram in accordance with one or more example embodiments of the disclosure.

In at least one aspect of some embodiments, the arming logic element 104, which may be described in further detail with respect to FIG. 3, may serve to arm, or initiate operations of, the second distance protection element 108. The arming logic element 104 may receive a signal from the disturbance detector 102, and the signal may provide an indication that the disturbance detector 102 has detected a disturbance in the transmission line. Based on this received indication that a disturbance has been detected in the transmission line, the arming logic element 104 may choose to arm, or initiate operations of, the second distance protection element 108.

In some embodiments, the first distance protection element 106 may be a regular phasor-based distance protection element, that is, the first distance protection element 106 may use algorithms such as full-cycle DFT to perform fault detection. Thus, the first distance protection element 106 may serve to detect and clear transmission line faults. The first distance protection element 106 may be under constant operation regardless of the status and operation of any of the other elements of the system architecture 100 (e.g., the disturbance detector 102, the arming logic element 104, and second distance protection element 108).

In at least one aspect of some embodiments, the second distance protection element 108 may be a separate distance protection element from the first distance protection element 106 and may serve as an accelerator and/or a compliment to the first distance protection element 106. That is, the second distance protection element 108 may serve to assist the first distance protection element 106 in detecting and clearing faults, and does not always have to be in constant operation like the first distance protection element 106. In some instances, the second distance protection element 108 may only be active for certain periods of time, such as a period of three power cycles, for example. The second distance protection element 108 may also differ from the first distance protection element 106 in that the second distance protection element 108 may be based on a sub-cycle distance protection algorithm that may use a short window phasor estimation method. The term "sub-cycle" may refer to less than a full power cycle on the transmission line. The amount of time a single cycle takes may be dependent on the frequency used in the transmission line. The number of cycles in a second may be equivalent to the frequency of the transmission line in Hertz. The short window phasor estimation method may also take into account decaying direct current (DC) so as to minimize the adverse impact to phasor accuracy of DC offset. That is, the short window phasor estimation method may allow for sub-cycle operation while maintaining system robustness (less sensitive to noise in the transmission line).

In some embodiments, the second distance protection element 108 may receive an arming signal from the arming logic element 104. The arming signal may provide an indication to the second distance protection element 108 to initiate any of the operations described herein with respect to the second distance protection element 108. Once the second distance protection element 108 receives the arming signal and is armed, a timer with a three cycle drop-out delay may open a three-cycle window to allow the sub-cycle algorithm of the second distance protection element 108 to run. Once this window of three cycles expires, the second distance protection element 108 may only be able to be armed again by the arming logic element 104 if the system returns to "normal" operation and remains under normal operation for at least five consecutive cycles. Normal operation may refer to three phase voltages and currents being in balance (for example, 120 degrees phase shift between phases and same magnitude), the frequency being around 50 Hz (or 60 Hz), and/or the magnitude of voltages are close to 1.0 p.u.

In at least one aspect of some embodiments, the one or more inputs 110 may include a current input 112 and a voltage input 114. The current input 112 and voltage input 114 may be received from the transmission line, and may be used to determine the existence and location of a fault on the transmission line.

In at least one aspect of some embodiments, the system may also include a communications network. The communications network may allow any of the elements of the illustrative architecture 100 to communicate with one another, and may allow any and all of such elements to communicate with remote components, such as a remote server. The communications network may include, but is not limited to, any one or a combination of different types of suitable communications networks such as, for example, cable networks, public networks (e.g., the Internet), private networks, wireless networks, cellular networks, or any other suitable private and/or public networks. Further, the communications network may have any suitable communication range associated therewith and may include, for example, global networks (e.g., the Internet), metropolitan area networks (MANs), wide area networks (WANs), local area networks (LANs), or personal area networks (PANs). In addition, the communications network may include any type of medium over which network traffic may be carried including, but not limited to, coaxial cable, twisted-pair wire, optical fiber, a hybrid fiber coaxial (HFC) medium, microwave terrestrial transceivers, radio frequency communication mediums, satellite communication mediums, or any combination thereof. In some instances, the communications network may include cellular (e.g., 5G), Wi-Fi, or Wi-Fi direct.

In at least one aspect of some embodiments, any of the elements in the system, such as the disturbance detector 102, arming logic element 104, first distance protection element 106 and second distance protection element 108 (which hereinafter may be simply referred to as "the elements of the system") may comprise at least one or more processor(s), memory, and one or more operation module(s). In some embodiments, the functionality of the module(s) described herein (for example, the operation module(s)) may also be implemented as a single module or any other number of module(s).

In at least one aspect of some embodiments, the elements of the system may include one or more processors that may include any suitable processing unit capable of accepting digital data as input, processing the input data based on stored computer-executable instructions, and generating output data. The computer-executable instructions may be stored, for example, in data storage and may include, among other things, operating system software and application software. The computer-executable instructions may be retrieved from the data storage and loaded into the memory as needed for execution. The processor may be configured to execute the computer-executable instructions to cause various operations to be performed. Each processor may include any type of processing unit including, but not limited to, a central processing unit, a microprocessor, a microcontroller, a Reduced Instruction Set Computer (RISC) microprocessor, a Complex Instruction Set Computer (CISC) microprocessor, an Application Specific Integrated Circuit (ASIC), a System-on-a-Chip (SoC), a field-programmable gate array (FPGA), and so forth.

The memory may be volatile memory (memory that is not configured to retain stored information when not supplied with power) such as random access memory (RAM) and/or non-volatile memory (memory that is configured to retain stored information even when not supplied with power) such as read-only memory (ROM), flash memory, and so forth. In various implementations, the memory may include multiple different types of memory, such as various forms of static random access memory (SRAM), various forms of dynamic random access memory (DRAM), unalterable ROM, and/or writeable variants of ROM such as electrically erasable programmable read-only memory (EEPROM), flash memory, and so forth.

The operation module(s) may perform operations including at least receiving one or more current and voltage inputs. The operations may also include determining, based on the one or more current and voltage inputs, one or more current and voltage phasors, wherein the one or more current and voltage phasors are determined using a short window phasor estimation. The operations may also include determining, within a single power cycle and based on the one or more current and voltage phasors, a fault in a transmission line. The operations may also include sending, to a distance protection element and based on the determination that the fault exists, a signal to clear the fault in the transmission line. The operations may also include clearing the fault in the transmission line. The operation module(s) may also perform any of the other operations described herein.

It should be appreciated by one skilled in the art that any of the operations described with reference to any of the elements of illustrative architecture 100 may be performed locally at the transmission line or at a remote location, such as a remote server.

FIG. 2 depicts an illustrative system flow diagram 200 in accordance with one or more example embodiments of the disclosure. In some embodiments, FIG. 2 may depict a flow diagram for a disturbance detector (such as the disturbance detector 102) in greater detail. As described with reference to FIG. 1, the disturbance detector 102 may be a fault detector for detecting faults in the transmission line. The disturbance detector 102 may operate by receiving as inputs a positive sequence current 206, negative sequence current 208, and a zero sequence current 210. The positive, negative, and zero sequence currents may represent individual phases of a three-phase power system. For example, a three-phase power system used in conjunction with the transmission line described herein. The disturbance detector 102 may then perform a first comparison 212, second comparison 214, and third comparison 216. The first comparison 212 may involve a determination as to whether the difference between the positive sequence current 206 and a positive sequence current from two cycles prior is greater than about 0.01 per unit (p.u.). Thus, the comparison may be performed at a granular level and the disturbance detector 102 may be very sensitive to changes in current values over progressive power cycles. Additionally, the comparison is not limited to a current and a current from only two cycles prior. Any current measurement from any number of cycles prior may also be used. The disturbance detector 102 may similarly perform a second comparison 214 to determine whether the difference between the negative sequence current 208 and a negative sequence current from two cycles prior is greater than about 0.01 p.u. The disturbance detector 102 may also perform a third comparison 216 to determine whether the difference between the zero sequence current 210 and a zero sequence current from two cycles prior is greater than about 0.01 p.u. If any of the first comparison 212, second comparison 214, and/or third comparison 216 lead to a determination of a difference greater than about 0.01 p.u., then a logical OR operand 218 may be triggered and a signal 220 may be provided at an output that indicates a disturbance has been detected.

FIG. 3 depicts an illustrative system flow diagram 300 in accordance with one or more example embodiments of the disclosure. In at least one aspect of some embodiments, FIG. 3 may depict a flow diagram for an arming logic element (such as the arming logic element 104) in greater detail. As described with reference to FIG. 1, the arming logic element 104 may serve to arm, or to initiate operations of, the second distance protection element 108, and may do so based on a signal from the disturbance detector 102 that a disturbance has been detected. For example, the signal may be output signal 220 from flow diagram 200.

In at least one aspect of some embodiments, the flow diagram 300 may begin with one or more inputs. The one of more inputs may include a first set of inputs 302 that may be used to determine whether a transmission line is undergoing normal operation. If a disturbance is detected, then it may be determined that some or all of the conditions tested by the first set of inputs 302 may be broken. The first set of inputs 302 may include a disturbance indication 324, which may be the same as the output signal 220 from the flow diagram 200, which may be the output of the disturbance detector 102. The first set of inputs 302 may also include a SIG_OK value 306. The SIG_OK value 306 may indicate whether there is a problem with measurements (for example, transmission line measurements). The first set of inputs 302 may also include a second input 308 involving a determination that an $I_{0MAG}$ value is less than about 0.2 p.u. $I_{0MAG}$ may be a variable representing a zero sequence current magnitude. The first set of inputs 302 may also include a third input 310 involving a determination that an $I_{2MAG}$ value is less than about 0.2 p.u. $I_{2MAG}$ may represent the magnitude of the negative sequence current. The first set of inputs 302 may also include a fourth input 312 involving a determination that an $V_{0MAG}$ value is less than about 0.2 p.u. $V_{0MAG}$ may represent the magnitude of the zero-sequence voltage. The first set of inputs 302 may also include a fifth input 314 involving a determination that an $V_{2MAG}$ value is less than about 0.2 p.u. $V_{2MAG}$ may represent the magnitude of the negative-sequence voltage. The first set of inputs 302 may also include a sixth input 316 involving a determination that an $V_{1MAG}$ value is less than about 1.2 p.u but greater than about 0.8 p.u. $V_{1MAG}$ may represent the magnitude of the positive-sequence voltage. The first set of inputs 302 may also include a seventh input 318 involving a determination that an absolute value of $f_{SRC}-f_{TRACK}$ is less than about 0.5 Hz. The first set of inputs 302 may also include an eight input 320 involving a determination that an absolute value of $f_{SRC}-f_{NOM}$ is less than about 5.5 Hz. $f_{SRC}$ may represent a measurement of frequency from the source, $f_{TRACK}$ may represent a measurement of frequency from the system for sampling tracking, and $f_{NOM}$ may represent a rated normal frequency, such as 50 or 60 Hz, for example. The first set of inputs 303 may also include an OPEN POLE OP value 322, which may represent a signal for the breaker status. For example, if the breaker is opened, the OPEN POLE OP may be 1, if the breaker is closed, the OPEN POLE OP may be zero.

In some embodiments, the system flow diagram 300 may also include an AND logical operator 328 following the first set of inputs 302, such that all of the first set of inputs 302 may be required to be true to fulfill the AND logical operator 328. A first timer 326 may also be an input to the AND logical operator 328. The first timer 326 may involve zero pickup delay (for example, when an input picks up, the output may pick up immediately), and may also involve 2 pp drop-out delay (for example, when the input drops out, the output may drop out at 2 pp time later). pp may refer to two protection passes, which may further refer to 2*8=16 samples, with respect to 64 samples per cycle. For example, 2 pp may be ¼ cycle. The system flow diagram 300 may also include a second AND logical operator 332. The second AND logical operator 332 may receive as inputs at least a subcycle enabled setting 304 and a second timer 330. The second timer 330 may involve a 5 cycle pick up delay and a 2 pp drop-out delay. Following the second AND logical operator 332 may be a third timer 334. The third timer may involve zero pickup delay and a 3 cycle drop out delay.

Figure 4:
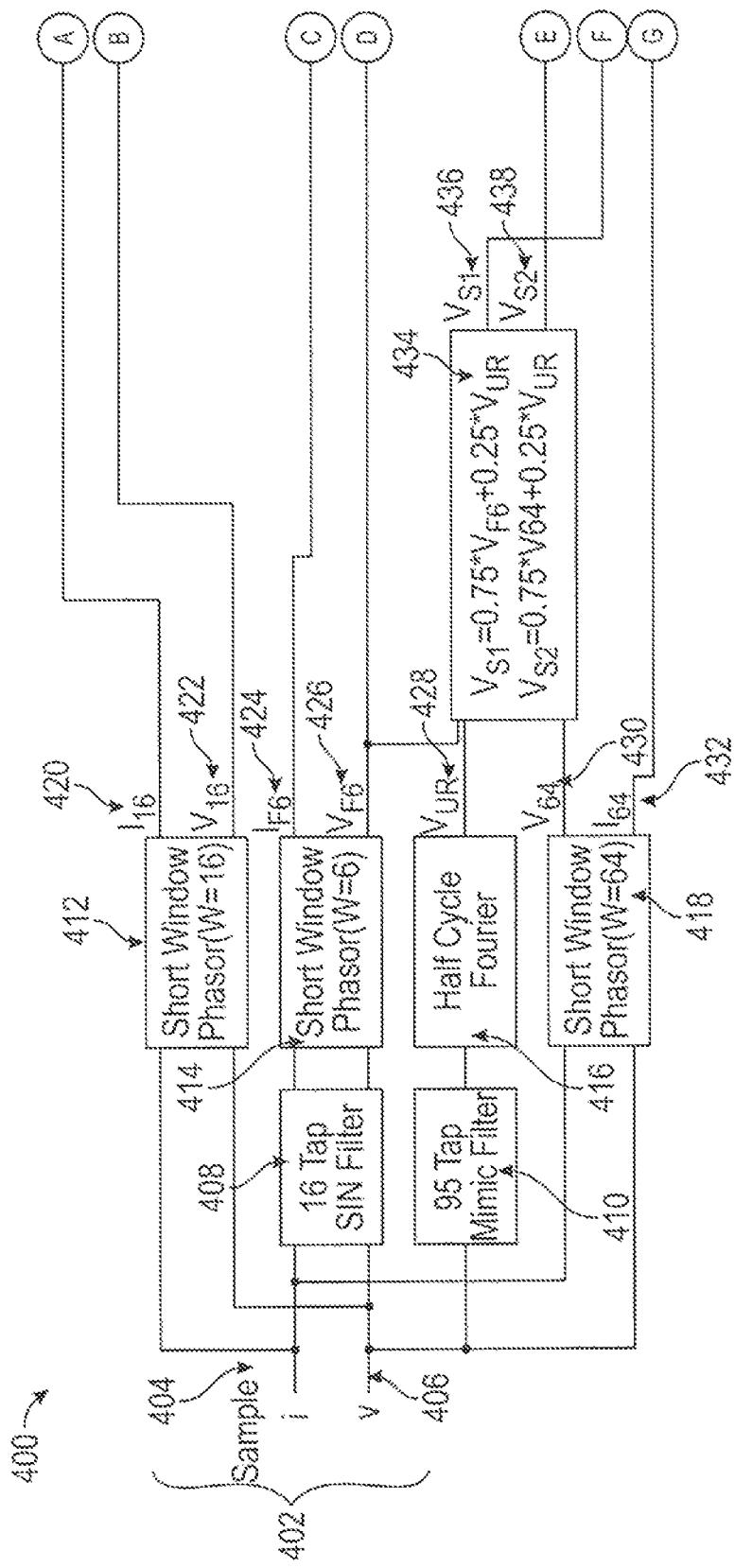
FIG. 4 depicts an illustrative system flow diagram in accordance with one or more example embodiments of the disclosure.

FIG. 4 depicts an illustrative system flow diagram depicting a sub-cycle algorithm 400 in accordance with one or more example embodiments of the disclosure. In some embodiments, FIG. 4 may depict a flow diagram for a distance protection element (such as the second distance protection element 108) in greater detail. The sub-cycle algorithm 400 may begin by sampling one or more current inputs 404 and one or more voltage inputs 406, which may collectively be referred to as one or more inputs 402. The inputs 402 may be obtained from the transmission line. Once the inputs 402 are obtained, the sub-cycle algorithm 400 may then proceed to determine one or more phasors (for example, phasors 420, 422, 424, 426, 428, 430, and/or 432).

In some embodiments, the phasors (for example, phasors 420, 422, 424, 426, 428, 430, and/or 432) may be determined through a number of varying methods. For example, a first current phasor 420 (depicted as 116 in FIG. 4) may be determined using a short window phasor method using a window size of 16 with respect to 64 samples per cycle. The window size may refer to the number of samples that are taken from a particular power cycle in a transmission line. For example, the number of samples per cycle may be 64. Thus, a window size of 16 would mean the window size is also 0.25 or a quarter of a power cycle, and would also mean that 16 samples were taken. Different window sizes may be used to ensure that all application test cases can be passed with a subcycle trip. In addition to the first current phasor 420, a first voltage phasor 422 (depicted as $V_{16}$ in FIG. 4) may be determined using the short window phasor method using a window size of 16.

In at least one aspect of some embodiments, the short window phasor estimation may be an algorithm for determining a phasor. The short window phasor estimation algorithm may be performed in real-time, that is, the real time voltage or current samples may be operated a convolution with a coefficient vector which may be obtained off-line, that is, the coefficient vector may not need to be performed instantaneously. The short window phasor estimation algorithm may begin with setting a decaying DC time constant, which may be referred to as Ta. Additionally, poles of fundamental frequency and decaying DC components may be determined using Equations 1, 2, and 3 below. In Equations 1, 2, and 3, Ts may be the sampling period and N may be the number of samples per-cycle. For example, if the fundamental frequency is about 50 Hz, the number of samples per-cycle may be 64 and the sampling period may be about 0.0003125 seconds.

$$z_0 = e^{-Ts/Ta} \quad \text{(Equation 1)}$$

$$z_1 = e^{j\frac{2\pi}{N}} \quad \text{(Equation 2)}$$

$$z_2 = e^{-j\frac{2\pi}{N}} \quad \text{(Equation 3)}$$

In some embodiments, the short window phasor estimation algorithm may then involve setting a short window, W. A W*3 dimension matrix may be determining using W and $Z_0$, $Z_1$, and $Z_2$ from Equations 1, 2, and 3. The matrix may be defined as matrix M shown below, where W is the short window size.

$$M = \begin{bmatrix} z_0^{W-1} & \frac{z_1^{W-1}}{2} & \frac{z_2^{W-1}}{2} \\ z_0^{W-2} & \frac{z_1^{W-2}}{2} & \frac{z_2^{W-2}}{2} \\ \cdots & \cdots & \cdots \\ z_0^1 & \frac{z_1^1}{2} & \frac{z_2^1}{2} \\ 1 & 1 & 1 \end{bmatrix}$$

In some embodiments, a solution matrix may be determined using the matrix M. The solution matrix may be determined using Equation 4 presented below.

$$H = (M^T M)^{-1} M^T \quad \text{(Equation 4)}$$

After determining the solution matrix H, the second row of matrix H may be extracted as a vector of coefficients, h, which may be shown in Equation 5 below. The vector of coefficients, h, may be the same length as the window length, W. The set of element included within h may be complex values used for calculating a phasor.

$$h(1:W) = H(2, 1:W) \quad \text{(Equation 5)}$$

Once the vector, h, is determined, phasors may be calculated. Phasors may be calculated using Equation 6 presented below, which may involve a discrete convolution operation, and where x(n) may be a digital signal and the phasor may be X(n).

$$X(n) = \sum_{k=1}^{W} h(k) x(n - k + 1) \quad \text{(Equation 6)}$$

As an example, if the window length, W, is set to 6, the coefficients may be:
h6_real=[−9.317384299; 1.676320496; 7.28413487; 7.39902364; 1.966327809; −9.015714202];
h6_imag=[0.627852294; −0.70007482; −1.23026262; −0.949793625; 0.146519721; 2.056085852];
If the window length is 16, the coefficients may be:
h16_real=[−0.596934514; −0.389107751; −0.204224934; −0.044330175; 0.088770461; 0.193526319; 0.268657068; 0.313165001; 0.326344617; 0.307789393; 0.257395664; 0.175363602; 0.062195257; −0.081310307; −0.254064731; −0.454700877]
h16_imag=[0.297247297; 0.158486922; 0.038069882; −0.062647918; −0.142498351; −0.200512295; −0.235928952; −0.248203151; −0.237010579; −0.202250887; −0.144048634; −0.062752069; 0.041070246; 0.166634931; 0.31295135; 0.478831178]
If the window length is 64, the coefficients may be:
h64_real=[0.015387604; 0.015156533; 0.014777881; 0.014255279; 0.013593743; 0.012799627; 0.011880565; 0.010845389; 0.009704052; 0.00846753; 0.007147713; 0.005757295; 0.004309649; 0.002818698; 0.001298785; −0.000235473; −0.001769316; −0.003287992; −0.004776893; −0.006221699; −0.007608515; −0.008924004; −0.010155516; −0.01129121; −0.01232017; −0.013232505; −0.014019448; −0.014673442; −0.015188208; −0.01555881; −0.015781699; −0.01585475; −0.015777281; −0.015550058; −0.015175292; −0.014656614; −0.013999041; −0.013208929; −0.012293908; −0.011262814; −0.0101256; −0.00889324; −0.007577628; −0.006191455; −0.004748096; −0.003261476; −0.001745935; −0.000216093; 0.00131329;

0.002827463; 0.004311816; 0.005752029; 0.007134207; 0.008445012; 0.009671793; 0.010802711; 0.011826846; 0.012734309; 0.013516333; 0.014165358; 0.014675107; 0.015040642; 0.015258414; 0.015326297];
h64_imag=[0.002613433; 0.004170765; 0.005698708; 0.007182654; 0.00860842; 0.009962383; 0.011231613; 0.012403997; 0.013468358; 0.014414556; 0.015233594; 0.0159177; 0.016460401; 0.016856588; 0.017102564; 0.01719608; 0.017136356; 0.016924091; 0.01656145; 0.016052052; 0.015400928; 0.014614475; 0.013700396; 0.012667624; 0.011526235; 0.010287354; 0.008963045; 0.007566198; 0.006110399; 0.004609808; 0.003079014; 0.0015329; −1.35E-05; −0.001545159; −0.003047173; −0.004504934; −0.005904256; −0.007231514; −0.008473775; −0.009618925; −0.010655781; −0.011574204; −0.012365193; −0.013020971; −0.013535066; −0.013902363; −0.014119165; −0.014183219; −0.014093742; −0.013851429; −0.013458444; −0.012918402; −0.012236332; −0.011418627; −0.010472988; −0.009408343; −0.008234767; −0.006963381; −0.005606247; −0.004176249; −0.002686974; −0.001152574; 0.000412362; 0.00199295]

In some embodiments, the phasors may also include a second current phasor 424 and a second voltage phasor 426 (depicted as $I_{F6}$ and $V_{F6}$ respectively in FIG. 4). The second current phasor 424 and a second voltage phasor 426 may be determined using the short window phasor method using a window size of 6, with respect to 64 samples per-cycle. However, to determine the second current phasor 424 and a second voltage phasor 426 additional noise filtering of the inputs 402 may be required prior to performing the short window phasor method. The noise filtering may be performed by a filtering element 408, which in some instances may more specifically be a 16 TAP SIN Filter, which may be a band pass filter. However, any other type of noise filter may also be applicable. In the instances where a 16 TAP SIN Filter is employed, the following coefficients may be used:
[0.050481199; 0.143758291; 0.215149487; 0.253786123; 0.253786123; 0.215149487; 0.143758291; 0.050481199; −0.050481199; −0.143758291; −0.215149487; −0.253786123; −0.253786123; −0.215149487; −0.143758291; −0.050481199]

In some embodiments, the phasors may also include a third voltage phasor 436 and a fourth voltage phasor 438 (depicted as $V_{S1}$ and $V_{S2}$ respectively in FIG. 4). The third voltage phasor 436 and a fourth voltage phasor 438 may be determined through Equations 7 and 8 respectively, which are shown below.

$$V_{S1}=0.75*V_{F6}+0.25*V_{UR} \quad \text{(Equation 7)}$$

$$V_{S2}=0.75*V_{64}+0.25*V_{UR} \quad \text{(Equation 8)}$$

As shown in Equations 7 and 8, the determination of third voltage phasor 436 and a fourth voltage phasor 438 may also involve determining a value of $V_{UR}$ and $V_{64}$. $V_{UR}$ may represent a voltage phasor calculated by a conventional half-cycle Fourier Transform and $V_{64}$ may represent a voltage phasor calculated by the short-window algorithm, which may be characterized by a window length of 64 samples with respect to 64 samples per cycle. In some instances, $V_{UR}$ may be determined using a half cycle DFT. However, before the half cycle DFT is performed to obtain $V_{UR}$, additional noise filtering of the inputs 402 may be required. The noise filtering may be performed by a filtering element 410, which in some instances may more specifically be a 95 TAP Mimic Filter. However, any other type of noise filter may also be applicable. Additionally, in some instances, $V_{64}$ may be determined using the short window phasor method using a window size of 64 (which may be, for example, equivalent to a full power cycle and sample size of 64). In the instances where a 95 TAP Mimic Filter is employed, the following coefficients may be used:
[0.005053975; 0.016389844; 0.03404435; 0.056632217; 0.081219206; 0.10369089; 0.11950201; 0.12463672; 0.1165479; 0.094834744; 0.061473999; 0.020528406; −0.022612198; −0.062281797; −0.093632118; −0.11351274; −0.12094045; −0.11707082; −0.10471324; −0.08754176; −0.069218546; −0.052895207; −0.041936986; −0.033449907; −0.026454358; −0.02049092; −0.015310547; −0.010765766; −0.00676318; −0.003239881; −0.000150699; 0.002539093; 0.004858095; 0.006831396; 0.00848215; 0.009832512; 0.010904162; 0.011718568; 0.012297077; 0.012660898; 0.012831015; 0.012828071; 0.012672226; 0.01238302; 0.011979237; 0.011478784; 0.010898587; 0.010254508; 0.009561275; 0.008832444; 0.008080367; 0.007316189; 0.006549855; 0.005790135; 0.005044657; 0.004319958; 0.003621536; 0.002953916; 0.002320715; 0.001724712; 0.001167927; 0.000651686; 0.000176701; −0.000256863; −0.000649316; −0.001001378; −0.001314116; −0.001588886; −0.001827279; −0.002031069; −0.002202172; −0.002342599; −0.002454424; −0.00253975; −0.002600682; −0.002679091; −0.002803179; −0.002991414; −0.003247781; −0.003557384; −0.003886095; −0.004184926; −0.004398538; −0.004476194; −0.004382649; −0.004106378; −0.003663068; −0.003093437; −0.002455836; −0.001815358; −0.001231991; −0.000750539; −0.000394452; −0.000164647; −4.31223E-05];

In some embodiments, the phasors may also include a third current phasor 432 (depicted as $I_{64}$ in FIG. 4). The third current phasor 432 may be determined using the short window phasor method using a window size of 64.

In some embodiments, one or more of the phasors may be selected based on the type of transformer that is included within the system (for example, magnetic VT, passive or active CVT). In general, a transformer may be a voltage measurement device, and may transform a high voltage to a low voltage and then take measurements to be sent to a substation for protection and control purposes. The transformer may also be capacitor voltage transformer (CVT) or magnetic voltage transformer (VT). This, for example, may depend on whether the transformer is a magnetic voltage transformer, passive capacitor, or active capacitor voltage transformer. Additionally, the type of transformer may determine the location of a switch 446. The switch 446 may be used to switch between various logic blocks associated with each of the types of transformers. For example, if a magnetic voltage transformer is involved, the switch 446 may be closed at a first switch position 448 associated with a magnetic voltage transformer logic block 440. If a passive capacitor voltage transformer is involved, the switch 446 may be closed at a second switch position 450 associated with a passive capacitor voltage transformer logic block 442. If an active capacitor voltage transformer is involved, the switch 446 may be closed at a third switch position 450 associated with an active capacitor voltage transformer logic block 444. These logic blocks (e.g., 440, 442, and 444) may perform logical operations as described with respect to Equations 9, 10, and 11 respectively.

In some embodiments, in the scenario where the system includes a magnetic voltage transformer, the first voltage phasor 422 and first current phasor 420 may be selected if a number of samples is less than or equal to a number of samples associated with one cycle. Otherwise, if the number of samples is greater than the number of samples associated with one cycle, the fourth voltage phasor 438 and the third current phasor 432 may be selected. The conditional logic for selecting the particular phasors may also be shown below in Equation 9. In Equation 9, n may represent the number of samples, which may be the number of samples just after a fault occurs. N may represent the number of samples per power cycle, V may represent the selected voltage phasor, and I may represent the selected current phasor.

$$\text{If } n \leq N+1 \rightarrow V = V_{16}; I = I_{16}$$

$$\text{else} \rightarrow V = V_{S2}; I = I_{64} \quad \text{(Equation 9)}$$

In some embodiments, in the scenario where the system includes a passive capacitor voltage transformer, the second voltage phasor 426 and second current phasor 424 may be selected if a number of samples is less than or equal to a number of samples associated with one cycle. Otherwise, if the number of samples is greater than the number of samples associated with one cycle, the fourth voltage phasor 438 and the third current phasor 432 may be selected. The conditional logic for selecting the particular phasors may also be shown below in Equation 10. In Equation 10, n may represent the number of samples, which may be the number of samples just after a fault occurs, N may represent the number of samples per power cycle, V may represent the selected voltage phasor, and I may represent the selected current phasor.

$$\text{If } n \leq N+1 \rightarrow V = V_{F6}; I = I_{F6}$$

$$\text{else} \rightarrow V = V_{S2}; I = I_{64} \quad \text{(Equation 10)}$$

In some embodiments, in the scenario where the system includes an active capacitor voltage transformer, the second voltage phasor 426 and second current phasor 424 may be selected if a number of samples is less than or equal to a number of samples associated with half of a cycle. If the number of samples is greater than the number of samples associated with half of a cycle but less than the number of samples associated with a full cycle, then the third voltage phasor 436 and the second current phasor 424 may be selected. If the number of samples is greater than the number of samples associated with one cycle but less than the number of samples associated with two cycles then the third voltage phasor 436 and the second current phasor 424 may be selected. Finally, if the number of samples is greater than the number of samples associated with two cycles then the fourth voltage phasor 438 and the third current phasor 424 may be selected. The conditional logic for selecting the particular phasors may also be shown below in Equation 11. In Equation 11, n may represent the number of samples, which may be the number of samples just after a fault occurs, N may represent the number of samples per power cycle, V may represent the selected voltage phasor, and I may represent the selected current phasor.

$$\begin{aligned} &\text{if } n \leq \frac{N}{2} \rightarrow V = V_{F6}; I = I_{F6} \\ &\text{elseif } N+1 \geq n > \frac{N}{2} \rightarrow V = V_{S1}; I = I_{F6} \\ &\text{elseif } 2*N+1 \geq n > N+1 \rightarrow V = V_{S1}; I = I_{64} \\ &\text{else} \rightarrow V = V_{S2}; I = I_{64} \end{aligned} \quad \text{(Equation 11)}$$

In some embodiments, once the phasors are selected, they may be fed into the element of discriminative criterion of distance protection element 450, where a fault may be identified. If an internal fault is detected, then a signal to open the breaker may be sent. For example, determining the fault may involve determining the ratio of the voltage and current phasors compared with a setting impedance.

Figure 5:
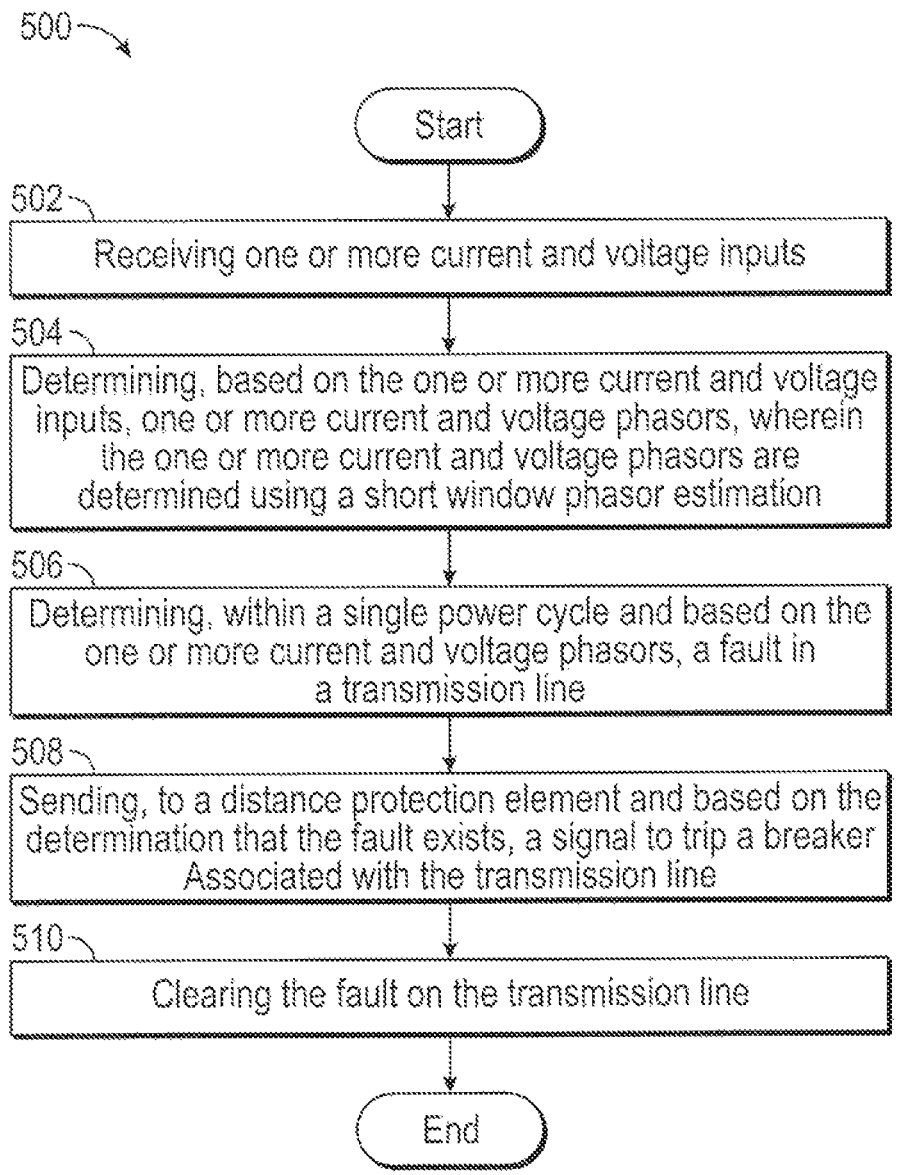
FIG. 5 illustrates an example method flow in accordance with one or more example embodiments of the disclosure.

FIG. 5 is a method flow 500 of an example method of the present disclosure. In some embodiments, the method may include an operation 502 of receiving one or more current and voltage inputs. The one or more current and voltage inputs may be received from the transmission line.

In at least one aspect of some embodiments, the method may include an operation 504 of determining, based on the one or more current and voltage inputs, one or more current and voltage phasors, wherein the one or more current and voltage phasors are determined using a short window phasor estimation. The one or more current and voltage phasors may be the current and voltage phasors 420-432 described with respect to FIG. 4. However, the current and voltage phasors may also be any other current and voltage phasors as well. The current and voltage phasors may be determined using varying window sizes, and as described previously herein, the window size may refer to the number of samples of the total number of samples in a given power cycle. For example, a first current phasor and a first voltage phasor may be determined using a window size of 16. A second current phasor and second voltage phasor may be determined using a window size of 6. Additionally, a noise filter may be required to filter the one or more current and voltage inputs prior to the second current phasor and the second voltage phasor being determined. In some instances, the noise filter may be a 16 TAP SIN Filter. A third voltage phasor and a fourth voltage phasor may be determined as a combination of other phasors. For example, the third voltage phasor may be determined by a combination of a phasor determined using a window size of 64 and a phasor determined using half-cycle DFT algorithm. The fourth voltage phasor may likewise be determined by a combination of a phasor determined using a window size of 6 and a phasor determined using half-cycle DFT algorithm. Finally, a third current phasor may be determined using a window size of 64.

In at least one aspect of some embodiments, the method may include an operation 506 of determining, within a single power cycle and based on the one or more current and voltage phasors, a fault in a transmission line. For example, determining the fault may involve determining the ratio of the voltage and current phasors compared with a setting impedance.

In at least one aspect of some embodiments, the method may include an operation 508 of sending, to a distance protection element and based on the determination that the fault exists, a signal to clear the fault in the transmission line.

In at least one aspect of some embodiments, the method may include an operation 510 of clearing the fault in the transmission line.

FIGS. 6-14 depict illustrative experimental results in accordance with one or more example embodiments of the disclosure. In some embodiments, all of FIGS. 6-14 depict various operating times relative to a percentage reach of a particular fault location in the transmission line for a distance protection element, such as the second distance protection element 108 with respect to FIGS. 1 and 4. For example, operating times may involve identifying that a fault is an internal fault. FIGS. 6-14 may also depict a comparison of operating times for different methods of distance protection algorithms, such as UR regular, UR fast, and sub-cycle, which may be described herein. FIGS. 6-14 may also depict that, on average, the sub-cycle distance protection algorithm may result in lower operating times than other algorithms, such as UR regular and UR fast.

Figure 6:
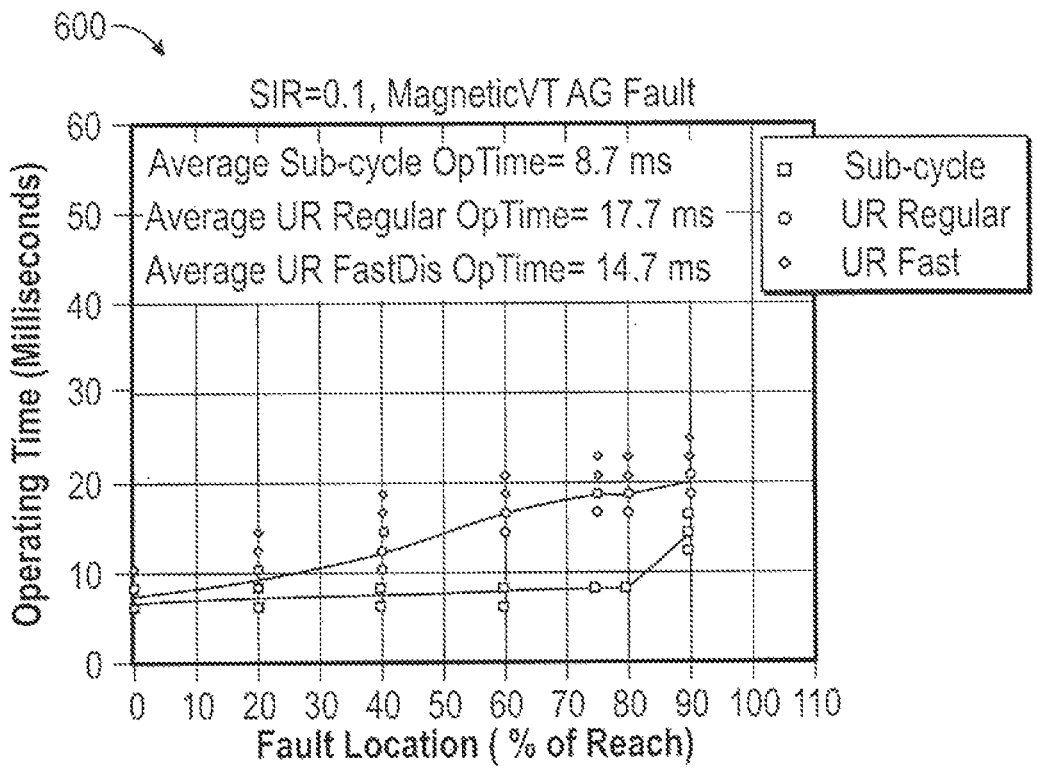
FIGS. 6-14 depict illustrative experimental results in accordance with one or more example embodiments of the disclosure.
Figure 7:
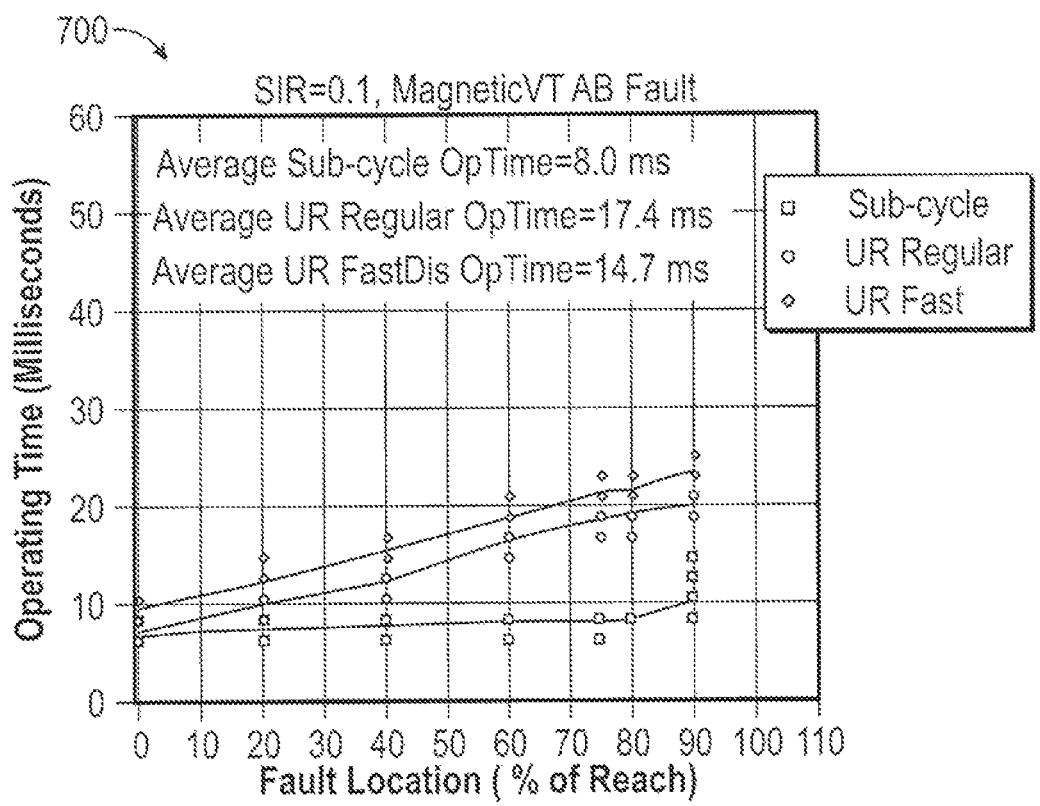
Figure 8:
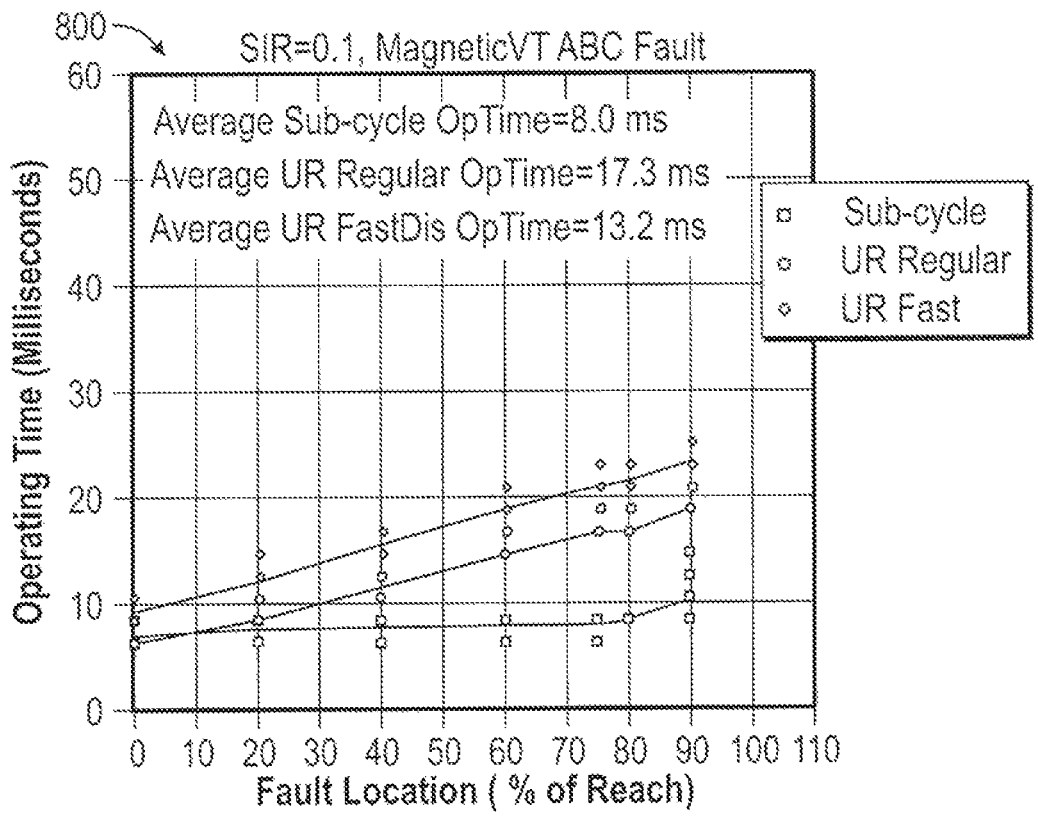

In at least one aspect of some embodiments, FIGS. 6-8 may in particular depict operating times for systems including a magnetic voltage transformer FIG. 6 may depict a plot 600 showing operating times for a system including a magnetic voltage transformer during an AG fault (for example, line to ground fault), FIG. 7 may depict a plot 700 showing operating times for a system including a magnetic voltage transformer during an AB fault (for example, phase to phase fault), and FIG. 8 may depict a plot 800 showing operating times for a system including a magnetic voltage transformer during an ABC fault (for example, three phase fault).

Figure 9:
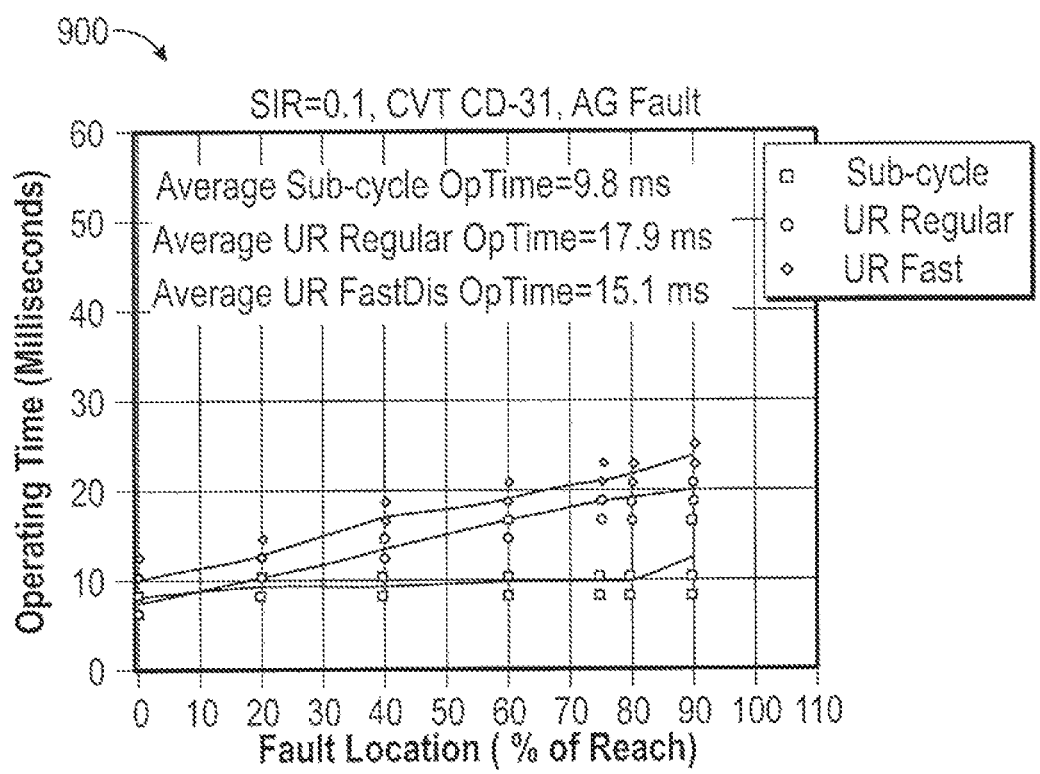
Figure 10:
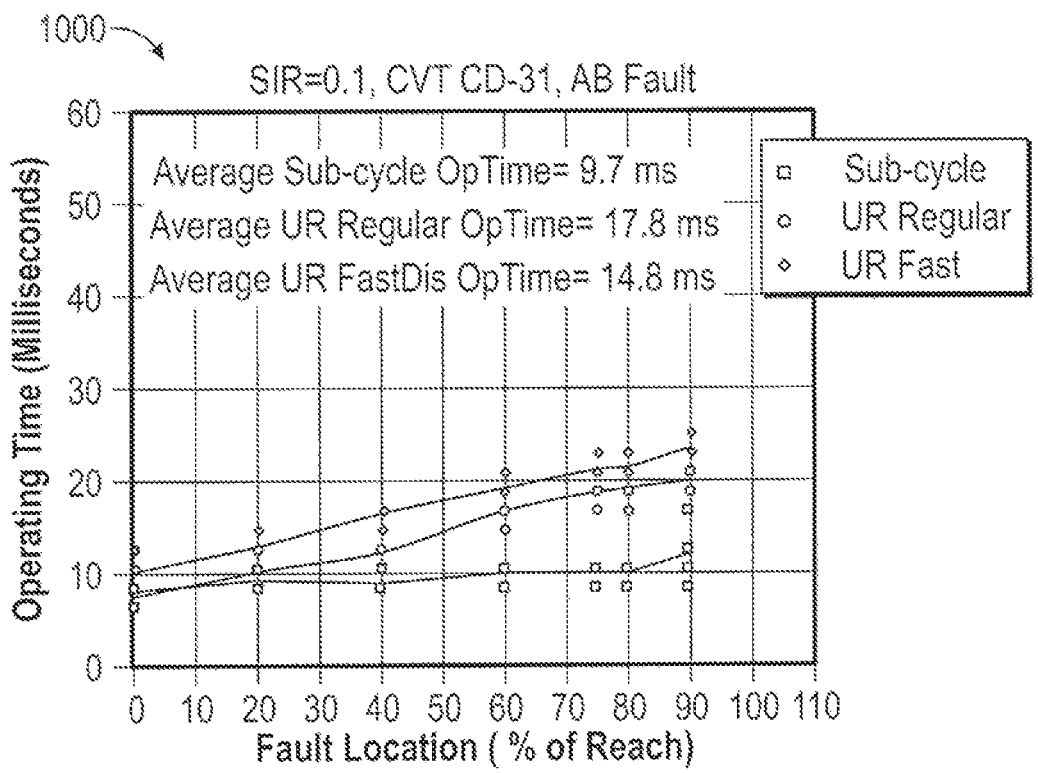
Figure 11:
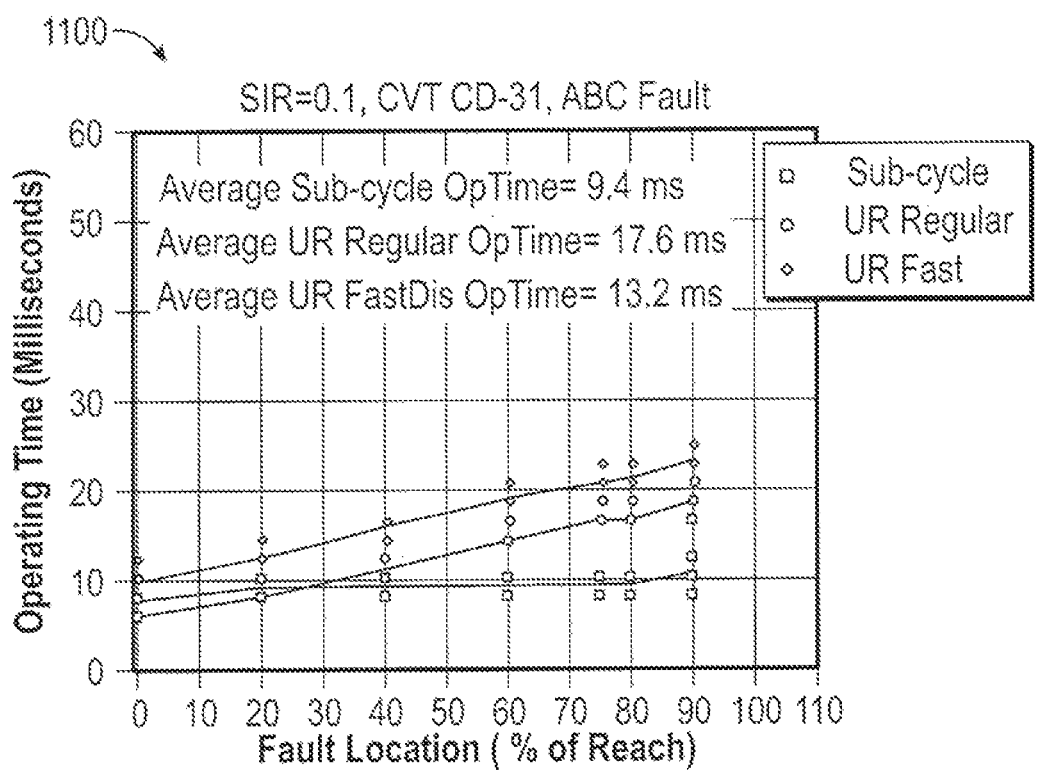

In at least one aspect of some embodiments, FIGS. 9-11 may in particular depict operating times for systems including an active capacitor voltage transformer. FIG. 9 may depict a plot 900 showing operating times for a system including an active capacitor voltage transformer during an AG fault (for example, line to ground fault), FIG. 10 may depict a plot 1000 showing operating times for a system including an active capacitor voltage transformer during an AB fault (for example, phase to phase fault), and FIG. 11 may depict a plot 1100 showing operating times for a system including an active capacitor voltage transformer during an ABC fault (for example, three phase fault).

Figure 12:
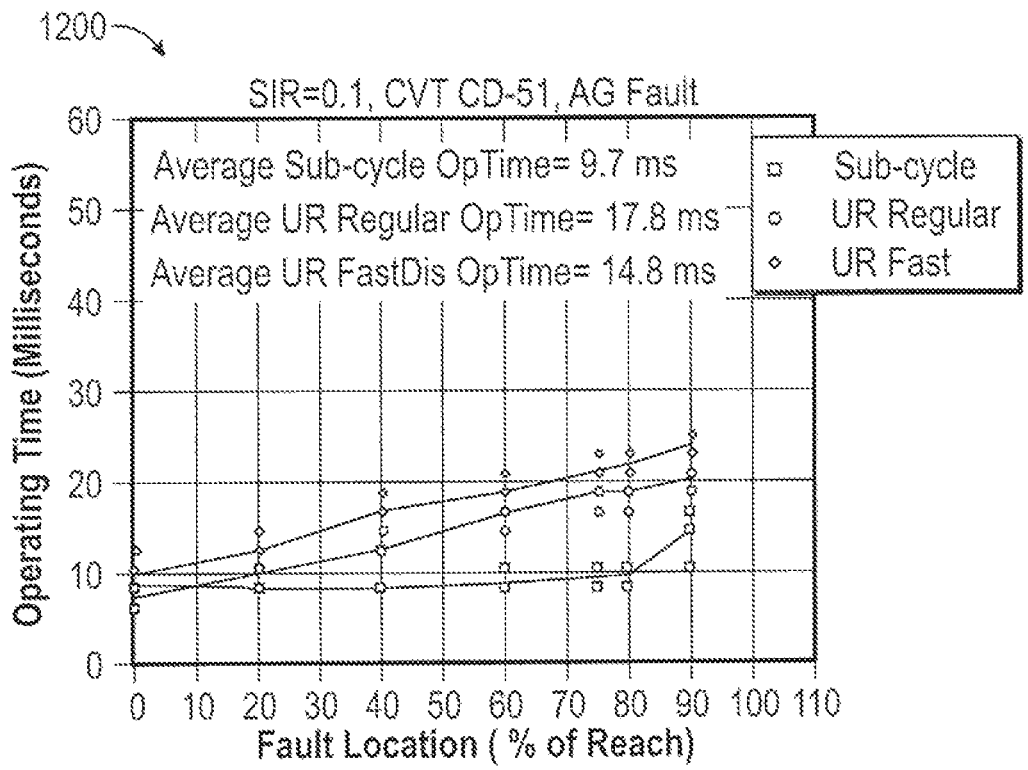
Figure 13:
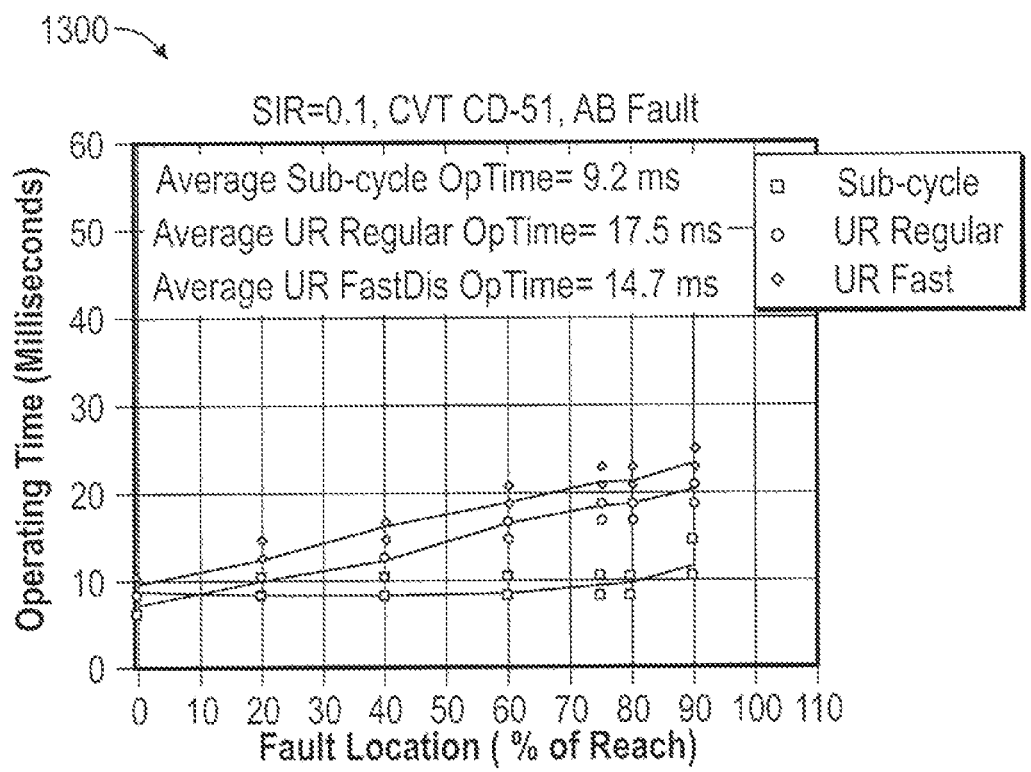
Figure 14:
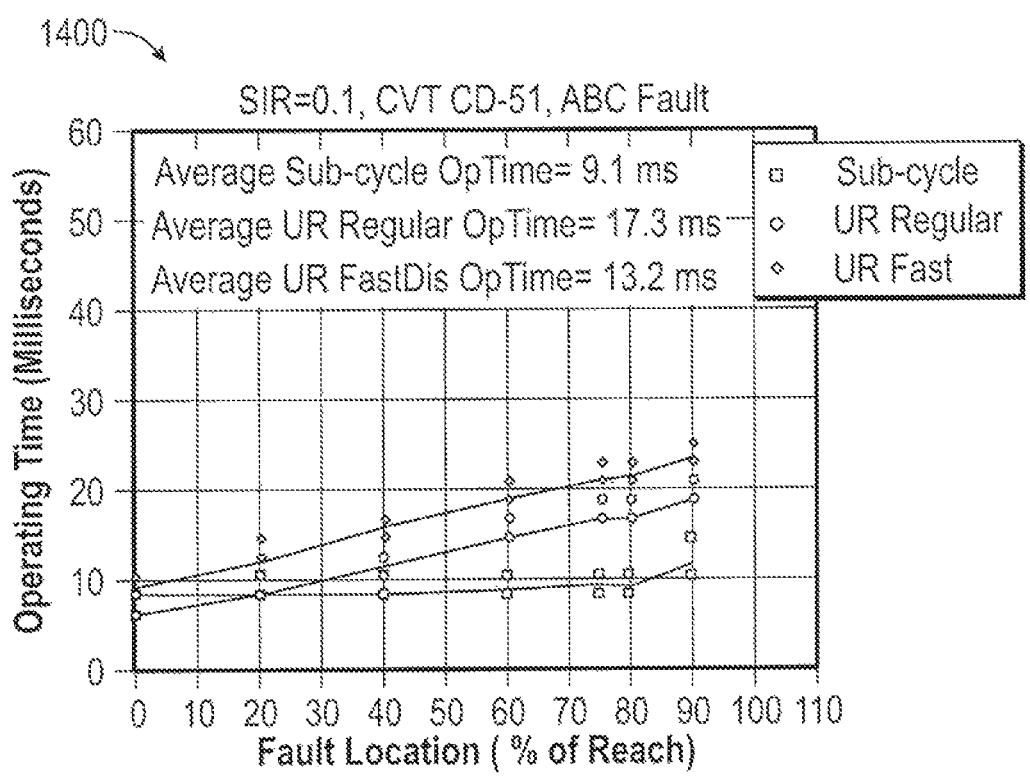

In at least one aspect of some embodiments, FIGS. 12-14 may in particular depict operating times for systems including a passive capacitor voltage transformer. FIG. 12 a plot 1200 showing may depict operating times for a system including the passive capacitor voltage transformer during an AG fault (for example, line to ground fault), FIG. 13 may depict a plot 1300 showing operating times for a system including the passive capacitor voltage transformer during an AB fault (for example, phase to phase fault), and FIG. 14 may depict a plot 1400 showing operating times for a system including the passive capacitor voltage transformer during an ABC fault (for example, three phase fault).

In the above disclosure, reference has been made to the accompanying drawings, which form a part hereof, which illustrate specific implementations in which the present disclosure may be practiced. It is understood that other implementations may be utilized, and structural changes may be made without departing from the scope of the present disclosure. References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, one skilled in the art will recognize such feature, structure, or characteristic in connection with other embodiments whether or not explicitly described.

Implementations of the systems, apparatuses, devices, and methods disclosed herein may comprise or utilize a special purpose or general-purpose computer including computer hardware, such as, for example, one or more processors and system memory, as discussed herein. Implementations within the scope of the present disclosure may also include physical and other computer-readable media for carrying or storing computer-executable instructions and/or data structures. Such computer-readable media can be any available media that can be accessed by a general purpose or special purpose computer system. Computer-readable media that stores computer-executable instructions is computer storage media (devices). Computer-readable media that carries computer-executable instructions is transmission media. Thus, by way of example, and not limitation, implementations of the present disclosure can comprise at least two distinctly different kinds of computer-readable media: computer storage media (devices) and transmission media.

Computer-executable instructions comprise, for example, instructions and data which, when executed at a processor, cause a general purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

While various embodiments of the present disclosure have been described above, it should be understood that they have been presented by way of example only, and not limitation. It will be apparent to persons skilled in the relevant art that various changes in form and detail can be made therein without departing from the spirit and scope of the present disclosure. Thus, the breadth and scope of the present disclosure should not be limited by any of the above-described exemplary embodiments but should be defined only in accordance with the following claims and their equivalents. The foregoing description has been presented for the purposes of illustration and description. It is not intended to be exhaustive or to limit the present disclosure to the precise form disclosed. Many modifications and variations are possible in light of the above teaching. Further, it should be noted that any or all of the aforementioned alternate implementations may be used in any combination desired to form additional hybrid implementations of the present disclosure. For example, any of the functionality described with respect to a particular device or component may be performed by another device or component. Further, while specific device characteristics have been described, embodiments of the disclosure may relate to numerous other device characteristics. Further, although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments may not include, certain features, elements, and/or steps. Thus, such conditional language is not generally intended to imply that features, elements, and/or steps are in any way required for one or more embodiments.

That which is claimed is:

1. A transmission line protection method comprising:
receiving one or more current and voltage inputs;
determining, based on the one or more current and voltage inputs, one or more sets of current and voltage phasors, wherein the one or more current and voltage phasors are determined using a short window phasor estimation with different window lengths;

determining, within a single power cycle and based on the one or more sets of current and voltage phasors, wherein the sets of voltage phasors are used to adapt to a particular type of voltage transformer and to different time after a fault occurs, a fault in a transmission line;

sending, to a distance protection element and based on the determination that the fault exists, a signal to clear the fault in the transmission line; and clearing the fault in the transmission line.

2. The method of claim 1, wherein short-window phasor estimation comprises:

determining a decaying Direct Current (DC) time constant;

determining poles of a decaying DC component using the decaying DC time constant;

determining poles of a fundamental frequency using a number of samples per power cycle;

determining, using the poles of the decaying DC component and the poles of the fundamental frequency, a matrix;

determining, based on the matrix, a coefficient matrix; and determining coefficients of the one or more current and voltage phasors using the coefficient matrix.

3. The method of claim 1, further comprising:

determining that the transmission line comprises a magnetic voltage transformer;

determining a first number of samples, the first number of samples comprising a number of samples after a fault disturbance detector is triggered and an arming event takes place;

determining that the first number of samples is less than or equal to a number of samples associated with one cycle; and determining, based on the determination that the first number of samples is less than or equal to a number of samples associated with one cycle, that the one or more current and voltage phasors are determined using a window size of 16 with respect to 64 samples per-cycle.

4. The method of claim 1, further comprising:

determining that the transmission line comprises a magnetic voltage transformer;

determining a first number of samples, the first number of samples comprising a number of samples after a fault disturbance detector is triggered and an arming event takes place;

determining that the first number of samples is greater than a number of samples associated with one cycle; and determining, based on the determination that the first number of samples is greater than a number of samples associated with one cycle, that the one or more current and voltage phasors comprise a current phasor determined using a window size of 64 with respect to 64 samples per-cycle and a voltage phasor determined by a combination of a phasor determined using a window size of 64 with respect to 64 samples per-cycle and a phasor determined using half-cycle Fourier.

5. The method of claim 1, further comprising:

determining that the transmission line comprises a passive capacitor voltage transformer;

determining a first number of samples, the first number of samples comprising a number of samples after a fault disturbance detector is triggered and an arming event takes place;

determining that the first number of samples is less than or equal to a number of samples associated with one cycle; and determining, based on the determination that the first number of samples is less than or equal to a number of samples associated with one cycle, that the one or more current and voltage phasors are determined using a window size of 6 with respect to 64 samples per-cycle.

6. The method of claim 1, further comprising:

determining that the transmission line comprises a passive capacitor voltage transformer;

determining a first number of samples, the first number of samples comprising a number of samples after a fault disturbance detector is triggered and an arming event takes place;

determining that the first number of samples is greater than a number of samples associated with one cycle; and determining, based on the determination that the first number of samples is greater than a number of samples associated with one cycle, that the one or more current and voltage phasors comprise a current phasor determined using a window size of 64 with respect to 64 samples per-cycle and a voltage phasor voltage phasor determined by a combination of a phasor determined using a window size of 64 with respect to 64 samples per-cycle and a phasor determined using half-cycle Fourier.

7. The method of claim 1, further comprising:

determining that the transmission line comprises an active capacitor voltage transformer;

determining a first number of samples, the first number of samples comprising a number of samples after a fault disturbance detector is triggered and an arming event takes place;

determining that the first number of samples is less than or equal to a number of samples associated with one half of a cycle; and determining, based on the determination that the first number of samples is greater than a number of samples associated with one half of a cycle, that the one or more current and voltage phasors are determined using a window size of 6 with respect to 64 samples per-cycle.

8. The method of claim 1, further comprising:

determining that the transmission line comprises an active capacitor voltage transformer;

determining a first number of samples, the first number of samples comprising a number of samples after a fault disturbance detector is triggered and an arming event takes place;

determining that the first number of samples is greater than to a number of samples associated with one half of a cycle and is less than or equal to a number of samples associated with one cycle; and determining, based on the determination that first number of samples is greater than to a number of samples associated with one half of a cycle and is less than or equal to a number of samples associated with one cycle, that the one or more current and voltage phasors comprise a current phasor determined using a window size of 6 with respect to 64 samples per-cycle and a voltage phasor determined by a combination of a phasor determined using a window size of 6 with respect to 64 samples per-cycle and a phasor determined using half-cycle Fourier.

9. The method of claim 1, further comprising:
determining that the transmission line comprises an active capacitor voltage transformer;
determining a first number of samples, the first number of samples comprising a number of samples after a fault disturbance detector is triggered and an arming event takes place;
determining that the first number of samples is less than or equal to a number of samples associated with two cycles; and
determining, based on the determination that the first number of samples is less than or equal to a number of samples associated with two cycles, that the one or more current and voltage phasors comprise a current phasor determined using a window size of 64 with respect to 64 samples per-cycle and a voltage phasor determined by a combination of a phasor determined using a window size of 6 with respect to 64 samples per-cycle and a phasor determined using half-cycle Fourier.

10. The method of claim 1, further comprising:
determining that the transmission line comprises an active capacitor voltage transformer;
determining a first number of samples, the first number of samples comprising a number of samples after a fault disturbance detector is triggered and an arming event takes place;
determining that the first number of samples is greater than a number of samples associated with two cycles; and
determining, based on the determination that the first number of samples is greater than a number of samples associated with two cycles, that the one or more current and voltage phasors comprise a current phasor determined using a window size of 64 with respect to 64 samples per-cycle and a voltage phasor voltage phasor determined by a combination of a phasor determined using a window size of 64 with respect to 64 samples per-cycle and a phasor determined using half-cycle Fourier.

11. A system comprising:
at least one processor; and
at least one memory storing computer-executable instructions, that when executed by the at least one processor, cause the at least one processor to:
receive one or more current and voltage inputs;
determine, based on the one or more current and voltage inputs, one or more sets of current and voltage phasors, wherein the one or more current and voltage phasors are determined using a short window phasor estimation with different window lengths;
determine, within a single power cycle and based on the one or more current and voltage phasors, wherein the set of voltage phasors are used to adapt to a particular type of voltage transformer and to a different time after a fault occurs, a fault in a transmission line;
send, to a distance protection element and based on the determination that the fault exists, a signal to clear the fault in the transmission line; and
clear the fault in the transmission line.

12. The system of claim 11, wherein the computer-executable instructions that cause the at least one processor to determine, based on the one or more current and voltage inputs, one or more current and voltage phasors further comprise computer-executable instructions to cause the at least one processor to:
determine a decaying Direct Current (DC) time constant;
determine poles of a decaying DC component using the decaying DC time constant;
determine poles of a fundamental frequency using a number of samples per power cycle;
determine, using the poles of the decaying DC component and the poles of the fundamental frequency, a matrix;
determine, based on the matrix, a coefficient matrix; and
determine coefficients of the one or more current and voltage phasors using the coefficient matrix.

13. The system of claim 11, wherein the computer-executable instructions further cause the at least one processor to:
determine that the transmission line comprises a magnetic voltage transformer;
determine a first number of samples, the first number of samples comprising a number of samples after a fault disturbance detector is triggered and an arming event takes place;
determine that the first number of samples is less than or equal to a number of samples associated with one cycle; and
determine, based on the determination that the first number of samples is less than or equal to a number of samples associated with one cycle, that the one or more current and voltage phasors are determined using a window size of 16 with respect to 64 samples per-cycle.

14. The system of claim 11, wherein the computer-executable instructions further cause the at least one processor to:
determine that the transmission line comprises a magnetic voltage transformer;
determine a first number of samples, the first number of samples comprising a number of samples after a fault disturbance detector is triggered and an arming event takes place;
determine that the first number of samples is greater than a number of samples associated with one cycle; and
determine, based on the determination that the first number of samples is greater than a number of samples associated with one cycle, that the one or more current and voltage phasors comprise a current phasor determined using a window size of 64 with respect to 64 samples per-cycle and a voltage phasor determined voltage phasor determined by a combination of a phasor determined using a window size of 64 with respect to 64 samples per-cycle and a phasor determined using half-cycle Fourier.

15. The system of claim 11, wherein the computer-executable instructions further cause the at least one processor to:
determine that the transmission line comprises a passive capacitor voltage transformer;
determine a first number of samples, the first number of samples comprising a number of samples after a fault disturbance detector is triggered and an arming event takes place;
determine that the first number of samples is less than or equal to a number of samples associated with one cycle; and
determine, based on the determination that the first number of samples is less than or equal to a number of samples associated with one cycle, that the one or more current and voltage phasors are determined using a window size of 6 with respect to 64 samples per-cycle.

16. The system of claim 11, wherein the computer-executable instructions further cause the at least one processor to:

determine that the transmission line comprises a passive capacitor voltage transformer;
determine a first number of samples, the first number of samples comprising a number of samples after a fault disturbance detector is triggered and an arming event takes place;
determine that the first number of samples is greater than a number of samples associated with one cycle; and
determine, based on the determination that the first number of samples is greater than a number of samples associated with one cycle, that the one or more current and voltage phasors comprise a current phasor determined using a window size of 64 with respect to 64 samples per-cycle and a voltage phasor voltage phasor determined by a combination of a phasor determined using a window size of 64 with respect to 64 samples per-cycle and a phasor determined using half-cycle Fourier.

17. The system of claim 11, wherein the computer-executable instructions further cause the at least one processor to:
determine that the transmission line comprises an active capacitor voltage transformer;
determine a first number of samples, the first number of samples comprising a number of samples after a fault disturbance detector is triggered and an arming event takes place;
determine that the first number of samples is less than or equal to a number of samples associated with one half of a cycle; and
determining, based on the determination that the first number of samples is less than or equal to a number of samples associated with one half of a cycle, that the one or more current and voltage phasors are determined using a window size of 6 with respect to 64 samples per-cycle.

18. The system of claim 11, wherein the computer-executable instructions further cause the at least one processor to:
determine that the transmission line comprises an active capacitor voltage transformer;
determine a first number of samples, the first number of samples comprising a number of samples after a fault disturbance detector is triggered and an arming event takes place;
determine that the first number of samples is greater than to a number of samples associated with one half of a cycle and is less than or equal to a number of samples associated with one cycle; and
determine, based on the determination that first number of samples is greater than to a number of samples associated with one half of a cycle and is less than or equal to a number of samples associated with one cycle, that the one or more current and voltage phasors comprise a current phasor determined using a window size of 6 with respect to 64 samples per-cycle and a voltage phasor determined by a combination of a phasor determined using a window size of 6 with respect to 64 samples per-cycle and a phasor determined using half-cycle Fourier.

19. The system of claim 11, wherein the computer-executable instructions further cause the at least one processor to:
determine that the transmission line comprises an active capacitor voltage transformer;
determine a first number of samples, the first number of samples comprising a number of samples after a fault disturbance detector is triggered and an arming event takes place;
determine that the first number of samples is less than or equal to a number of samples associated with two cycles; and
determine, based on the determination that the first number of samples is less than or equal to a number of samples associated with two cycles, that the one or more current and voltage phasors comprise a current phasor determined using a window size of 64 with respect to 64 samples per-cycle and a voltage phasor determined by a combination of a phasor determined using a window size of 6 with respect to 64 samples per-cycle and a phasor determined using half-cycle Fourier.

20. A non-transitory computer-readable medium storing computer-executable instructions which when executed by one or more processors result in performing operations comprising:
receiving one or more current and voltage inputs;
determining, based on the one or more current and voltage inputs, one or more sets of current and voltage phasors, wherein the one or more sets of current and voltage phasors are determined using a short window phasor estimation with different window lengths;
determining, within a single power cycle and based on the one or more sets of current and voltage phasors, wherein the one or more sets of voltage phasors are used to adap to a particular type of voltage transformer and a different after a fault occurs, a fault in a transmission line;
sending, to a distance protection element and based on the determination that the fault exists, a signal to clear the fault in the transmission line; and
clear the fault in the transmission line.

* * * * *